(12) United States Patent
Chiba et al.

(10) Patent No.: US 10,867,931 B2
(45) Date of Patent: Dec. 15, 2020

(54) MOS TRANSISTOR EMBEDDED SUBSTRATE AND SWITCHING POWER SUPPLY USING THE SAME

(71) Applicant: TDK CORPORATION, Tokyo (JP)

(72) Inventors: Hironori Chiba, Tokyo (JP); Toshiyuki Abe, Tokyo (JP)

(73) Assignee: TDK CORPORATION, Tokyo (JP)

(*) Notice: Subject to any disclaimer, the term of this patent is extended or adjusted under 35 U.S.C. 154(b) by 0 days.

(21) Appl. No.: 16/566,874

(22) Filed: Sep. 11, 2019

(65) Prior Publication Data

US 2020/0105677 A1 Apr. 2, 2020

(30) Foreign Application Priority Data

Sep. 27, 2018 (JP) .................. 2018-182574

(51) Int. Cl.
| | |
|---|---|
| H01L 29/66 | (2006.01) |
| H01L 23/538 | (2006.01) |
| H01L 25/07 | (2006.01) |
| H01L 23/31 | (2006.01) |
| H01L 23/00 | (2006.01) |
| H02M 3/158 | (2006.01) |

(52) U.S. Cl.
CPC ...... H01L 23/5389 (2013.01); H01L 23/3121 (2013.01); H01L 23/5383 (2013.01); H01L 23/5386 (2013.01); H01L 24/20 (2013.01); H01L 25/072 (2013.01); *H01L 2224/214* (2013.01); *H01L 2924/13091* (2013.01); *H02M 3/158* (2013.01)

(58) Field of Classification Search
CPC ............ H01L 23/5389; H01L 23/3121; H01L 23/5383; H01L 23/49575; H01L 23/49562; H01L 2224/214; H01L 25/702
See application file for complete search history.

(56) References Cited

U.S. PATENT DOCUMENTS

| | | | | |
|---|---|---|---|---|
| 8,067,796 B2* | 11/2011 | Hirler | ................. | H01L 23/4824 257/328 |
| 2008/0041619 A1 | 2/2008 | Lee et al. | | |
| 2016/0086876 A1* | 3/2016 | Otremba | ............ | H01L 23/4952 257/676 |
| 2017/0345714 A1* | 11/2017 | Scharf | .................... | H01L 24/06 |

FOREIGN PATENT DOCUMENTS

| | | |
|---|---|---|
| JP | 2008-047917 A | 2/2008 |
| JP | 6221221 B2 | 11/2017 |

* cited by examiner

*Primary Examiner* — Phuc T Dang
(74) *Attorney, Agent, or Firm* — Young Law Firm, P.C.

(57) ABSTRACT

Disclosed herein is a MOS transistor embedded substrate that includes first and second MOS transistors each having a source electrode formed on one surface and a drain electrode formed on other surface, and an insulation resin layer in which the first and second MOS transistors are embedded such that the source electrode of the first MOS transistor and the drain electrode of the second MOS transistor face a same direction and that the drain electrode of the first MOS transistor and the source electrode of the second MOS transistor face a same direction.

16 Claims, 20 Drawing Sheets

MOS TRANSISTOR EMBEDDED SUBSTRATE AND SWITCHING POWER SUPPLY USING THE SAME

BACKGROUND OF THE INVENTION

Field of the Invention

The present invention relates to a MOS transistor embedded substrate and a switching power supply using the MOS transistor embedded substrate and, more particularly, to a MOS transistor embedded substrate incorporating a so-called vertical MOS transistor in which current flows in the thickness direction of a semiconductor substrate and a switching power supply using such a MOS transistor embedded substrate.

Description of Related Art

As an IC embedded substrate incorporating a semiconductor chip, IC embedded substrates described in JP 2008-47917 A and Japanese Patent No. 6,221,221 are known. In many semiconductor chips, one or two or more transistors are formed on one main surface of a semiconductor substrate made of silicon or the like, so that an electrode pad is disposed only on the one main surface side of the semiconductor substrate.

On the other hand, a vertical MOS transistor used as a power device for a switching power supply is a device for making an ON-current to flow in the thickness direction of a semiconductor substrate, in which source and gate electrodes are disposed on one main surface, and a drain electrode is disposed on the other main surface. Normally, in such a vertical MOS transistor, the gate electrode and the like are connected to a lead frame using a conductive paste, a solder, a bonding wire or the like to draw the source, drain, and gate electrodes to the surface of an IC package.

However, the IC package packaging the vertical MOS transistor using the conductive paste, solder, bonding wire or the like may be insufficient in mechanical strength of a connection part formed of the conductive paste, solder, bonding wire or the like and is not always well suited for an application requiring high reliability, such as an on-vehicle application. Further, the connection part has high electrical resistance and insufficient heat radiation property.

To solve such a problem, a method of incorporating the vertical MOS transistor in a substrate in a bare-chip state. However, in order to constitute a switching power supply, it is necessary to use at least two MOS transistors and to connect the source electrode of one MOS transistor and the drain electrode of the other MOS transistor. For the foregoing reason, when the two MOS transistors are disposed side by side inside the substrate, the layout of the wiring pattern connecting the source electrode of one MOS transistor and the drain electrode of the other MOS transistor becomes complicated.

SUMMARY

It is therefore an object of the present invention to simplify the layout of the wiring pattern in a MOS transistor embedded substrate incorporating a plurality of vertical MOS transistors in a bare-chip state and a switching power supply using such a MOS transistor embedded substrate.

A MOS transistor embedded substrate according to the present invention includes first and second MOS transistors in each of which a source electrode is formed on one surface, and a drain electrode is formed on the other surface and an insulation resin layer in which the first and second MOS transistors are embedded such that the source electrode of the first MOS transistor and the drain electrode of the second MOS transistor face the same direction and that the drain electrode of the first MOS transistor and the source electrode of the second MOS transistor face the same direction.

According to the present invention, since the mounting directions of the first and second MOS transistors are opposite to each other, the source electrode of one MOS transistor and the drain electrode of the other MOS transistor can be connected easily.

The MOS transistor embedded substrate according to the present invention may further include a first terminal electrode connected to the source electrode of the first MOS transistor and the drain electrode of the second MOS transistor, a second terminal electrode connected to the drain electrode of the first MOS transistor, and a third terminal electrode connected to the source electrode of the second MOS transistor. With this configuration, it is possible to draw the terminals of the two series-connected MOS transistors to the outside.

The MOS transistor embedded substrate according to the present invention may further include a coupling wiring pattern connecting the source electrode of the first MOS transistor and the drain electrode of the second MOS transistor, and the first terminal electrode may be connected to the coupling wiring pattern. With this configuration, the source electrode of the first MOS transistor and the drain electrode of the second MOS transistor are short-circuited inside the MOS transistor embedded substrate, making it possible to reduce connection resistance between the first and second MOS transistors.

The MOS transistor embedded substrate according to the present invention may further include a first via conductor provided so as to penetrate the insulation resin layer and to connect the coupling wiring pattern and the first terminal electrode together. With this configuration, the source electrode of the first MOS transistor and the drain electrode of the second MOS transistor that face one surface side can be connected to the first terminal electrode positioned on the other surface. In this case, the first via conductor may be disposed between the first and second MOS transistors in a plan view. With this configuration, it is possible to make a resistance value between the first terminal electrode and the source electrode of the first MOS transistor and a resistance value between the first terminal electrode and the drain electrode of the second MOS transistor almost agree with each other.

The MOS transistor embedded substrate according to the present invention may include a first surface and a second surface positioned on the opposite side of the first surface, and the first to third terminal electrodes may be exposed on the first surface. With this configuration, the drain electrodes and source electrodes of the first and second MOS transistors can all be drawn to the first surface side.

The MOS transistor embedded substrate according to the present invention may further include a component mounting area on the second surface. This allows a part of or the entire switching power supply to be modularized by mounting a gate driver or a boot strap capacitor in the component mounting area.

The MOS transistor embedded substrate according to the present invention may further include a second via conductor provided so as to penetrate the insulation resin layer and to connect the drain electrode of the first MOS transistor and the second terminal electrode and a third via conductor provided so as to penetrate the insulation resin layer and to connect the source electrode of the second MOS transistor and the third terminal electrode. With this configuration, the drain electrode of the first MOS transistor and the source electrode of the second MOS transistor that face one surface side can be connected to the second and third terminal electrodes positioned on the other surface.

A switching power supply according to the present invention includes the above-described MOS transistor embedded substrate and a gate driver that supplies a drive signal to the gate electrodes of the respective first and second MOS transistors to turn ON the first and second MOS transistors in a mutually exclusive manner. With this configuration, it is possible to constitute a non-insulated synchronous rectification type step-down converter, a non-insulated synchronous rectification type boosting converter, a non-insulated synchronous rectification type reverse converter, a half-bridge insulated transformer, a full-bridge insulated transformer and the like.

In the present invention, the gate driver may be mounted on the MOS transistor embedded substrate, and a boot strap capacitor connected between the first terminal electrode and the gate driver may be mounted on the MOS transistor embedded substrate. This allows a part of or the entire switching power supply to be modularized, thus eliminating the need for mounting the gate driver or boot strap capacitor constituting the switching power supply on a separately provided circuit such as a mother board.

As described above, according to the present invention, it is possible to simplify the layout of the wiring pattern in a MOS transistor embedded substrate incorporating a plurality of vertical MOS transistors and a switching power supply using the same.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

First Embodiment

Figure 1:
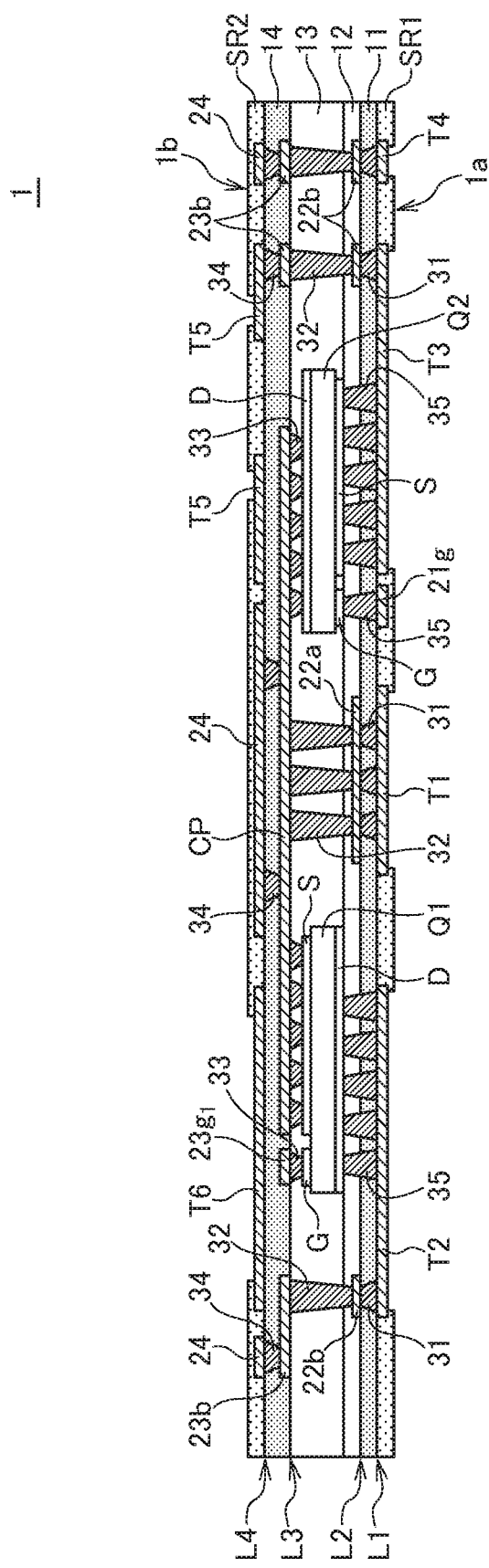
FIG. 1 is a schematic cross-sectional view for explaining the structure of a MOS transistor embedded substrate according to a first embodiment of the present invention.

FIG. 1 is a schematic cross-sectional view for explaining the structure of a MOS transistor embedded substrate 1 according to the first embodiment of the present invention.

As illustrated in FIG. 1, the MOS transistor embedded substrate 1 according to the first embodiment includes four insulation resin layers 11 to 14 and wiring layers L1 to L4 positioned on the surfaces of the respective insulation resin layers 11 to 14. Although not particularly limited, the insulation resin layer 11 as the lowermost layer and the insulation resin layer 14 as the topmost layer may each be a core layer obtained by impregnating a core material such as glass fiber with a resin material such as glass epoxy. On the other hand, the insulation resin layers 12 and 13 may each be made of a resin material that does not include a core material such as glass cloth. In producing the MOS transistor embedded substrate 1, the wiring layers L1 and L2 are first formed on both surfaces of the insulation resin layer 11, and then the insulation resin layer 12, insulation resin layer 13, wiring layer L3, insulation resin layer 14 and wiring layer L4 are formed in this order.

The insulation resin layer 11 as the lowermost layer and the wiring layer L1 formed on the insulation resin layer 11 are each partially covered with a solder resist SR1. Similarly, the insulation resin layer 14 as the topmost layer and the wiring layer L4 formed on the insulation resin layer 14 are each partially covered with a solder resist SR2. The solder resist SR1 constitutes one surface 1a of the MOS transistor embedded substrate 1, and the solder resist SR2 constitutes the other surface 1b of the MOS transistor embedded substrate 1.

The wiring layer L1 is formed on the lower surface of the insulation resin layer 11 and includes first to fourth terminal electrodes T1 to T4 and other conductor patterns 21 and 21g. The first to fourth terminal electrodes T1 to T4 and the conductor pattern 21 each have an exposed portion that is not covered with the solder resist SR1, and the exposed portion constitutes a connection terminal to a not-shown mother board.

The wiring layer L2 is formed on the upper surface of the insulation resin layer 11 so as to bite into the insulation resin layer 12 and includes conductor patterns 22a and 22b. The wiring layers L1 and L2 are connected to each other through a via conductor 31 penetrating the insulation resin layer 11.

The wiring layer L3 is formed on the upper surface of the insulation resin layer 13 so as to bite into the insulation resin layer 14 and includes a coupling wiring pattern CP and other conductor patterns 23b and $23g_1$. The wiring layers L2 and L3 are connected to each other through a via conductor 32 penetrating the insulation resin layers 12 and 13. Further, two MOS transistors Q1 and Q2 are embedded in the insulation resin layer 13. The MOS transistors Q1 and Q2 are each a bare chip of a vertical n-channel type MOS transistor in which an ON-current flows in the thickness direction of a semiconductor substrate made of silicon or the like and each have electrodes on the front and back thereof. The electrodes formed on the lower surfaces of the respective MOS transistors Q1 and Q2 are connected to the wiring layer L1 through a via conductor 35 penetrating the insulation resin layers 11 and 12. Further, the electrodes formed on the upper surfaces of the respective MOS transistors Q1 and Q2 are connected to the wiring layer L3 through a via conductor 33 penetrating the insulation resin layer 13.

The wiring layer L4 is formed on the upper surface of the insulation resin layer 14 and includes a conductor pattern 24. The wiring layers L3 and L4 are connected to each other through a via conductor 34 penetrating the insulation resin layer 14. The conductor pattern 24 has an exposed portion which is not covered with the solder resist SR2, and the exposed portion constitutes fifth and sixth terminal electrodes T5 and T6. The terminal electrodes T5 and T6 are used as connection terminals for accessing electronic components mounted on the surface 1b of the MOS transistor embedded substrate 1.

Figure 2:
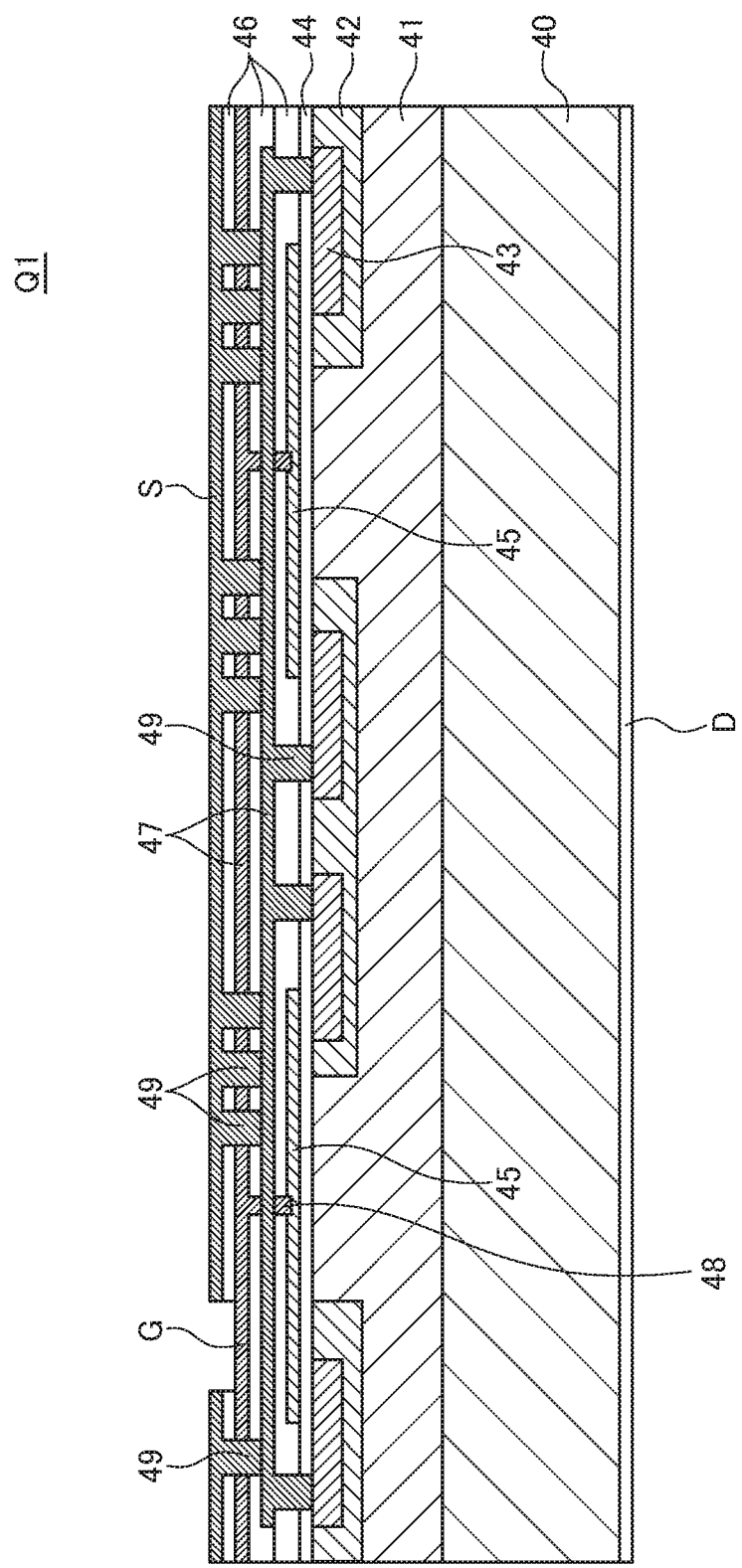
FIG. 2 is a schematic cross-sectional view for explaining the structure of the MOS transistor.

FIG. 2 is a schematic cross-sectional view for explaining the structure of the MOS transistor Q1. The MOS transistors Q1 and Q2 used in the present embodiment have the same shape, same structure and same characteristics. Thus, the MOS transistor Q2 has the same cross section as that illustrated in FIG. 2, and overlapping description will be omitted.

As illustrated in FIG. 2, the MOS transistor Q1 includes a silicon substrate 40 made of n-type silicon, an epitaxial layer 41 formed on the surface of the silicon substrate 40 and made of n-type silicon having a lower dopant concentration than the silicon substrate 40, a p-type impurity region 42 formed on the surface layer of the epitaxial layer 41, and an n-type impurity region 43 surrounded by the p-type impurity region 42. The surface of the epitaxial layer 41 is covered with a polysilicon gate 45 through a gate insulation film 44. A plurality of insulation layers 46, a plurality of wiring layers 47, and via conductors 48 and 49 each connecting different wiring layers 47 are formed on and above the gate insulation film and polysilicon gate 45. A gate electrode G is connected to the polysilicon gate 45 through the wiring layer 47 and the via conductor 48, and a source electrode S is connected to the n-type impurity region 43 through the wiring layer 47 and the via conductor 49. A drain electrode D ohmic-contacting the silicon substrate 40 is provided on the back surface of the silicon substrate 40.

In such a configuration, when a voltage exceeding a threshold value is applied to the gate electrode G, the p-type impurity region 42 is inverted to bring the n-type impurity region 43 and the epitaxial layer 41 into conduction. As a result, the MOS transistor Q1 is turned ON to bring the source electrode S and the drain electrode D into conduction.

As described above, the MOS transistor Q1 used in the present embodiment is a vertical device having a structure in which the gate electrode G and the source electrode S are formed on one surface, and the drain electrode D is formed on the other surface and in which an ON-current flows in the thickness direction of the silicon substrate when the MOS transistor Q1 is tuned ON. The MOS transistor Q2 has completely the same structure.

As illustrated in FIG. 1, the thus configured MOS transistors Q1 and Q2 are embedded in the MOS transistor embedded substrate 1 with the front and back sides thereof reversed from each other. Specifically, the MOS transistors Q1 and Q2 are embedded in the insulation resin layer 13 such that the gate electrode G and source electrode S of the MOS transistor Q1 and the drain electrode D of the MOS transistor Q2 face the same direction and that the drain electrode D of the MOS transistor Q1 and the gate electrode G and source electrode S of the MOS transistor Q2 face the same direction. In the present embodiment, the gate electrode G and source electrode S of the MOS transistor Q1 and the drain electrode D of the MOS transistor Q2 face upward (the surface 1b side of the MOS transistor embedded substrate 1), and the drain electrode D of the MOS transistor Q1 and the gate electrode G and source electrode S of the MOS transistor Q2 face downward (the surface 1a side of the MOS transistor embedded substrate 1).

Figure 3:
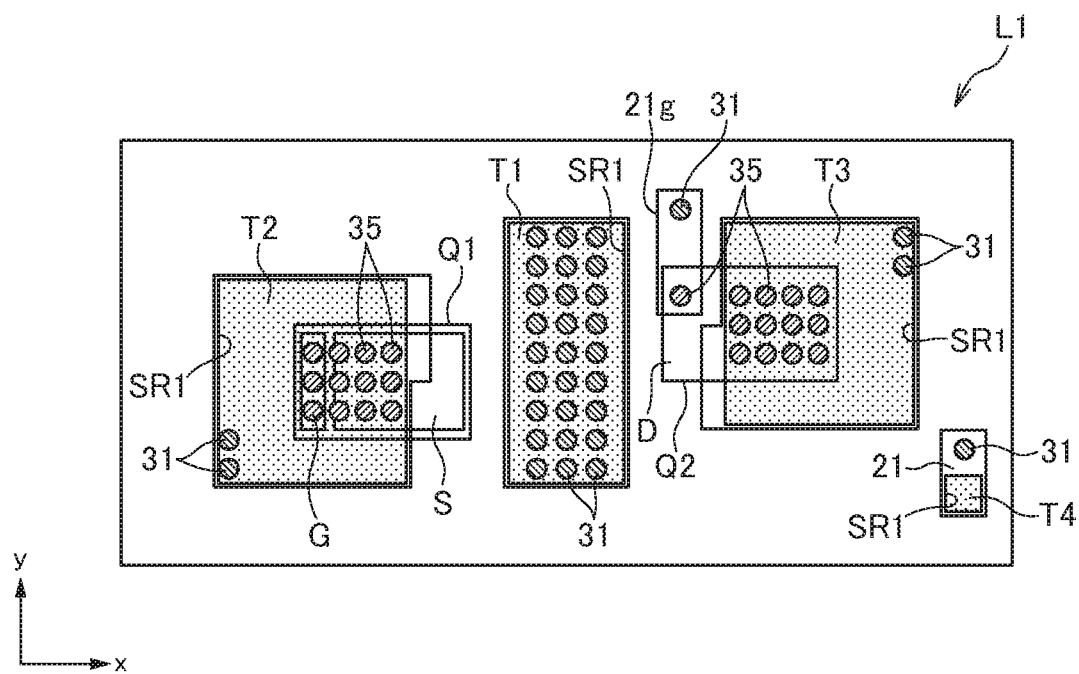
FIG. 3 is a plan view illustrating the pattern shapes of the wiring layer L1 according to the first embodiment of the present invention.
Figure 4:
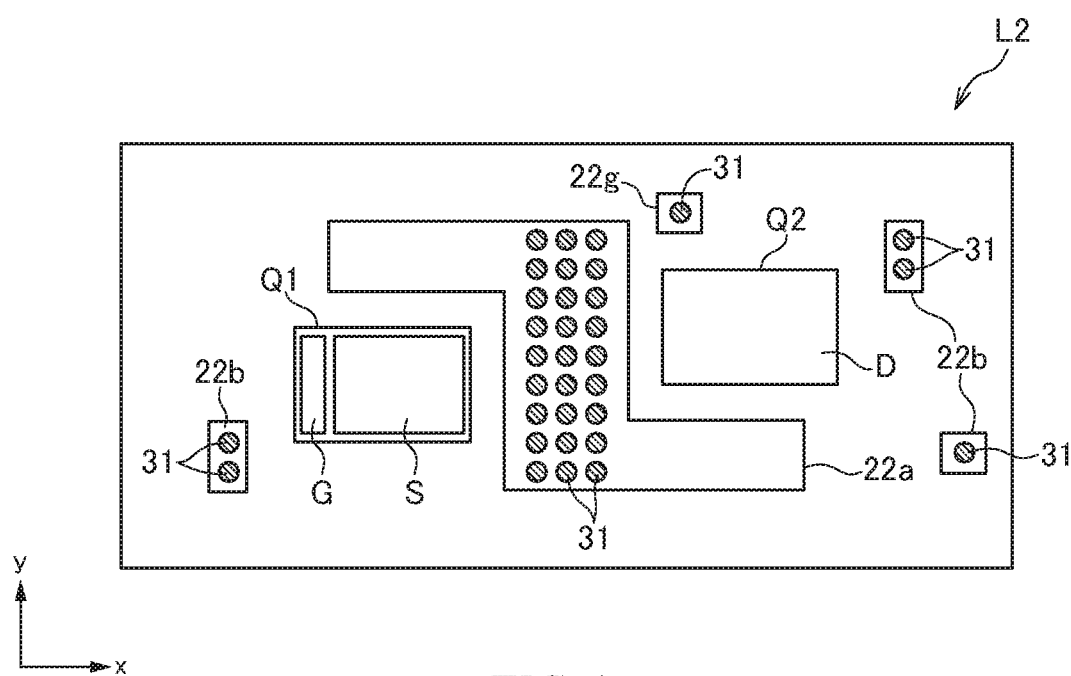
FIG. 4 is a plan view illustrating the pattern shapes of the wiring layer L2 according to the first embodiment of the present invention.
Figure 5:
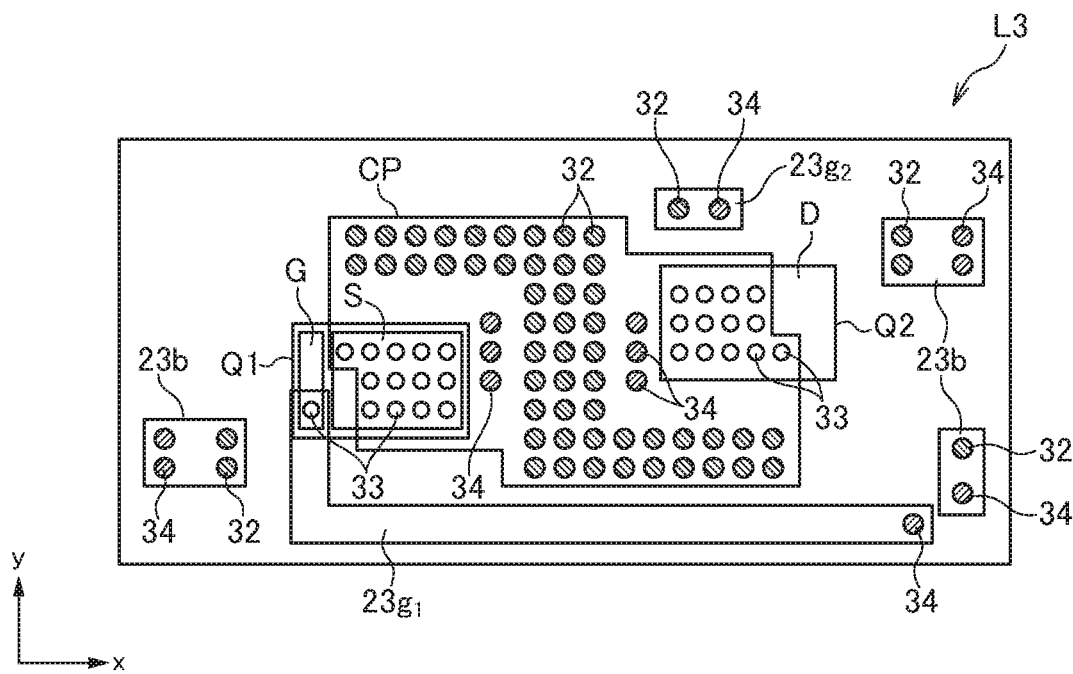
FIG. 5 is a plan view illustrating the pattern shapes of the wiring layer L3 according to the first embodiment of the present invention.

FIGS. 3 to 6 are plan views illustrating the pattern shapes of the wiring layers L1 to L4, respectively, as viewed from above (the surface 1b side). For easy understanding of the positional relationship among respective elements, the positions of the respective MOS transistors Q1 and Q2 viewed from the top are illustrated in FIGS. 3 to 5.

As illustrated in FIG. 3, the terminal electrode T2 and terminal electrode T3 included in the wiring layer L1 are disposed so as to be rotationally symmetrical with respect to the center of the substrate. The plane shape of a part of each of the terminal electrodes T2 and T3 that is exposed from the solder resist SR1 is substantially square. The terminal electrode T1 is disposed between the terminal electrodes T2 and T3 so as to overlap the center of the substrate. The plane shape of a part of the terminal electrode T1 that is exposed from the solder resist SR1 is rectangular. One edge (lower-side edge illustrated in FIG. 3) of the terminal electrode T1 that extends in the x-direction and one edge (lower-side edge illustrated in FIG. 3) of the terminal electrode T2 that extends in the x-direction have substantially the same y-coordinate. Similarly, the other edge (upper-side edge illustrated in FIG. 3) of the terminal electrode T1 that extends in the x-direction and one edge (upper-side edge illustrated in FIG. 3) of the terminal electrode T3 that extends in the x-direction have substantially the same y-coordinate. The terminal electrodes T1 to T3 are each connected with the plurality of via conductors 31, and the terminal electrodes T2 and T3 are each connected with the plurality of via conductors 35. The wiring layer L1 further has a fourth terminal electrode T4. The fourth terminal electrode T4 is a terminal to which a PWM control signal is externally input and is connected to the upper wiring layer through the conductor pattern 21 and the via conductor 31. The conductor pattern 21g is connected to the gate electrode G of the MOS transistor Q2 through the via conductor 35. The conductor pattern 21g is connected to the terminal electrode T5 through conductor patterns 22g, $23g_2$, and $24g_2$ to be described later.

As illustrated in FIG. 4, the conductor pattern 22a included in the wiring layer L2 is shaped like a crank so as to avoid the MOS transistors Q1 and Q2. The conductor pattern 22a completely covers the terminal electrode T1 provided on the wiring layer L1 and is connected to the terminal electrode T1 through the plurality of via conductors 31. Further, the wiring layer L2 has conductor patterns 22b and 22g. The conductor pattern 22b is connected to the wiring layer L1 through the via conductor 31 and to the wiring layer L3 through the via conductor 32. The conductor pattern 22g is connected to the conductor pattern 21g through the via conductor 31.

As illustrated in FIG. 5, the coupling wiring pattern CP included in the wiring layer L3 is disposed at a location overlapping the source electrode S of the MOS transistor Q1, the drain electrode D of the MOS transistor Q2 and the conductor pattern 22a provided on the wiring layer L2. The coupling wiring pattern CP completely covers the conductor pattern 22a provided on the wiring layer L2. The coupling wiring pattern CP, the source electrode S of the MOS transistor Q1 and the drain electrode D of the MOS transistor Q2 are connected through the via conductor 33. The coupling wiring pattern CP and the conductor pattern 22a provided on the wiring layer L2 are connected through the via conductor 32. As a result, the source electrode S of the MOS transistor Q1 and the drain electrode D of the MOS transistor Q2 are short-circuited by the coupling wiring pattern CP. Most of the via conductors 32 connecting the coupling wiring pattern CP and the conductor pattern 22a are disposed between the MOS transistors Q1 and Q2 in a plan view. The gate electrode G of the MOS transistor Q1 is connected to one end of the conductor pattern $23g_1$ through the via conductor 33. The other end of the conductor pattern $23g_1$ is connected to the wiring layer L4 through the via conductor 34. One end of the conductor pattern $23g_2$ is connected to the conductor pattern 22g through the via conductor 32, and the other end of the conductor pattern $23g_2$ is connected to the wiring layer L4 through the via conductor 34.

Figure 6:
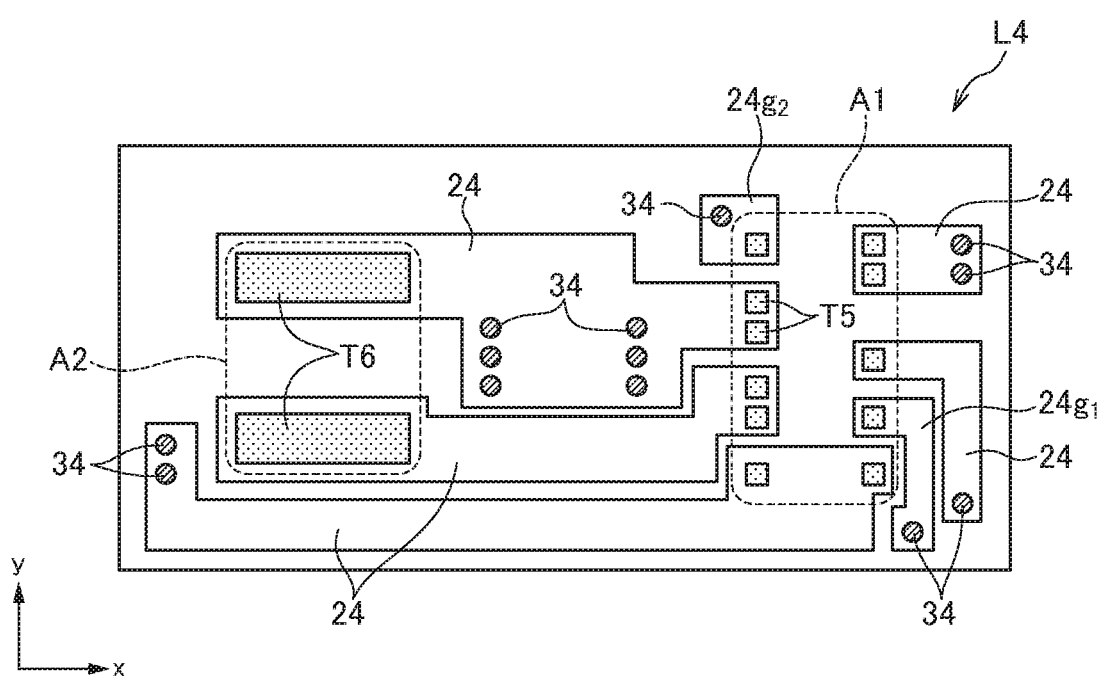
FIG. 6 is a plan view illustrating the pattern shapes of the wiring layer L4 according to the first embodiment of the present invention.

As illustrated in FIG. 6, conductor patterns 24, $24g_1$, and $24g_2$ are provided on the wiring layer L4. The conductor patterns 24, $24g_1$ and $24g_2$ are each connected to the wiring layer L3 through the via conductor 34 and are each partially exposed from the solder resist SR2. A part of the conductor pattern 24 that is exposed from the solder resist SR2 constitutes the terminal electrodes T5 and T6. The terminal electrodes T5 are positioned in a mounting area A1 of a gate driver to be described later, and the terminal electrodes T6 is positioned in a mounting area A2 of a boot strap capacitor to be described later. One of the terminal electrodes T5 is connected to the gate electrode G of the MOS transistor Q1 through the conductor pattern $24g_1$, and the other one thereof is connected to the gate electrode G of the MOS transistor Q2 through the conductor pattern $24g_2$.

With the configuration described above, the source electrode S of the MOS transistor Q1 and the drain electrode D of the MOS transistor Q2 are connected in common to the terminal electrode T1 through the via conductor 33, coupling wiring pattern CP, via conductor 32, conductor pattern 22a and via conductor 31. Further, the drain electrode D of the MOS transistor Q1 is connected to the terminal electrode T2 through the via conductor 35, and the source electrode S of the MOS transistor Q2 is connected to the terminal electrode T3 through the via conductor 35.

Figure 7:
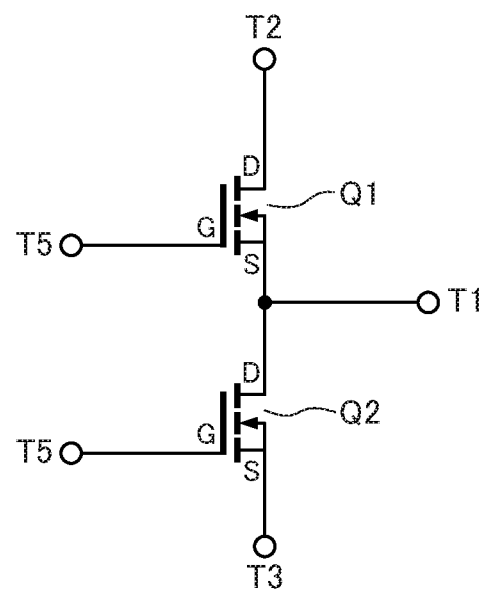
FIG. 7 is a circuit diagram illustrating the circuit configuration of the main part of the MOS transistor embedded substrate according to the first embodiment of the present invention.

FIG. 7 is a circuit diagram illustrating the circuit configuration of the main part of the MOS transistor embedded substrate 1 according to the present embodiment.

As illustrated in FIG. 7, the MOS transistor embedded substrate 1 according to the present embodiment has a circuit configuration in which the MOS transistors Q1 and Q2 are connected in series between the terminal electrodes T2 and T3, and the terminal electrode T1 is connected to the connection point between the MOS transistors Q1 and Q2. The gate electrodes G of the MOS transistors Q1 and Q2 are connected respectively to the terminal electrodes T5 illustrated in FIG. 6. When the MOS transistors Q1 and Q2 are connected in series as illustrated in FIG. 7, it is necessary to short-circuit the source electrode S of the MOS transistor Q1 and the drain electrode D of the MOS transistor Q2; therefore, when the MOS transistors Q1 and Q2 are incorporated in the substrate with the front and back sides thereof respectively facing the same directions, the layout of the coupling wiring pattern CP connecting the MOS transistors Q1 and Q2 becomes complicated. However, in the MOS transistor embedded substrate 1 according to the present embodiment, the MOS transistors Q1 and Q2 are embedded in the insulation resin layer 13 with the front and back sides thereof respectively being reversed from each other, making it possible to simplify the layout of the coupling wiring pattern CP.

Further, in the present embodiment, the coupling wiring pattern CP and the terminal electrode T1 are connected through the via conductor 32 positioned between the MOS transistors Q1 and Q2 in a plan view; therefore, it is possible to make the resistance value between the source electrode S of the MOS transistor Q1 and the terminal electrode T1 and the resistance value between the drain electrode D of the MOS transistor Q2 and the terminal electrode T2 almost agree with each other.

In addition, in the present embodiment, the terminal electrode T2 is disposed just under and connected, through the plurality of via conductors 35, to the drain electrode D of the MOS transistor Q1, and the terminal electrode T3 is disposed just under and connected, through the plurality of via conductors, to the source electrode S of the MOS transistor Q2. Thus, heat generated by the operation of the MOS transistors Q1 and Q2 is efficiently radiated to a mother board or the like through the via conductors 35. Further, the MOS transistors Q1 and Q2 in a bare-chip state are embedded in the insulation resin layer 13, and the gate electrodes G, source electrodes S and drain electrodes D thereof are directly connected with the via conductors 33 and 35, thus eliminating the need for using a conductor paste, a bonding wire or the like. Thus, mechanical strength can be significantly improved, making it possible to ensure high reliability even under severe use conditions.

Figure 8:
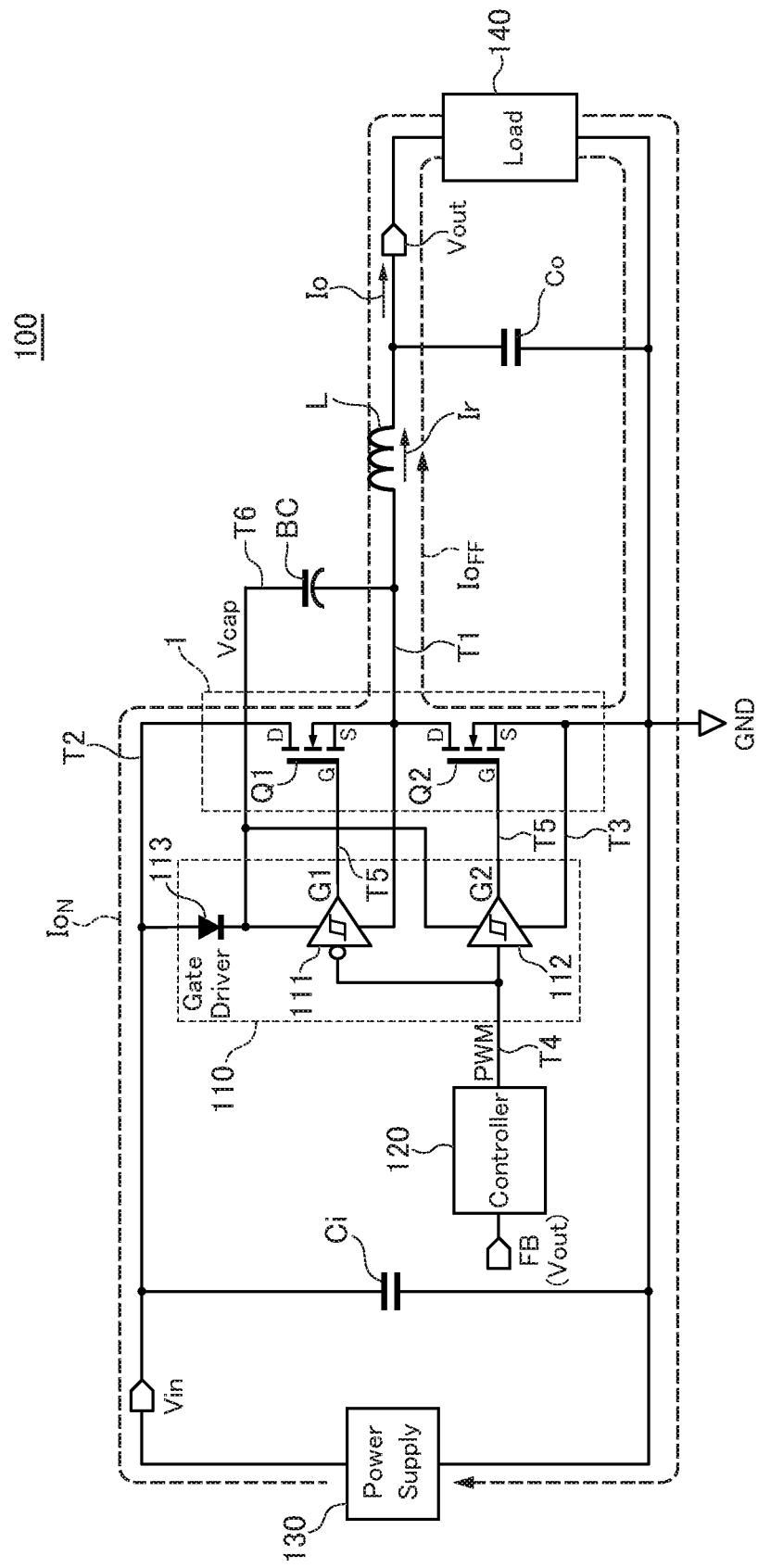
FIG. 8 is a circuit diagram of a switching power supply 100 using the MOS transistor embedded substrate according to the first embodiment of the present invention, where a non-insulated synchronous rectification type step-down converter is constituted.

FIG. 8 is a circuit diagram of a switching power supply 100 using the MOS transistor embedded substrate 1 according to the present embodiment. In the example of FIG. 8, a non-insulated synchronous rectification type step-down converter is constituted.

The switching power supply 100 illustrated in FIG. 8 includes the above-described MOS transistor embedded substrate 1, a gate driver 110, a controller 120, an input capacitor Ci, an output capacitor Co, an inductor L and a boot strap capacitor BC. As illustrated in FIG. 8, the terminal electrodes T2 and T3 of the MOS transistor embedded substrate 1 are connected to a DC power supply 130, and thus an input voltage Vin is applied between the terminal electrodes T2 and T3. The DC power supply 130 is connected in parallel with the input capacitor Ci to stabilize input voltage Vin. Further, the terminal electrode T1 of the MOS transistor embedded substrate 1 is connected to a load circuit 140 through the inductor L. The load circuit 140 is connected in parallel with the output capacitor Co, and output voltage Vout is smoothed by the inductor L and output capacitor Co. Further, a boot strap capacitor BC is connected between the terminal electrode T1 and the gate driver 110.

The gate driver 110 includes Schmitt trigger circuits 111, 112 and a diode 113 and is mounted in the mounting area A1 (FIG. 6) of the MOS transistor embedded substrate 1. The Schmitt trigger circuits 111 and 112 receive a PWM control signal supplied from the controller 120 to bring control signals G1 and G2 to an active level in a mutually exclusive manner to alternately turn ON the MOS transistors Q1 and Q2. In the present example, the controller 120 is disposed outside (e.g., on a mother board) the MOS transistor embedded substrate 1, and the PWM control signal is input to the MOS transistor embedded substrate 1 through the terminal electrode T4 illustrated in FIG. 3. The Schmitt trigger circuit 111 operates by voltage appearing between the cathode of the diode 113 and the terminal electrode T1, and the Schmitt trigger circuit 112 operates by voltage appearing between the cathode of the diode 113 and the terminal electrode T3. Since the boot strap capacitor BC is connected between the terminal electrode T1 and the cathode of the diode 113, sufficient operating voltage Vcap is supplied to the Schmitt trigger circuits 111 and 112 even while the MOS transistor Q1 is turned OFF. Further, even when the operating voltage Vcap becomes higher than the input voltage Vin of the DC power supply 130, backflow of current can be prevented due to insertion of the diode 113. The boot strap capacitor BC is mounted in the mounting area A2 (FIG. 6) of the MOS transistor embedded substrate 1.

Figure 9:
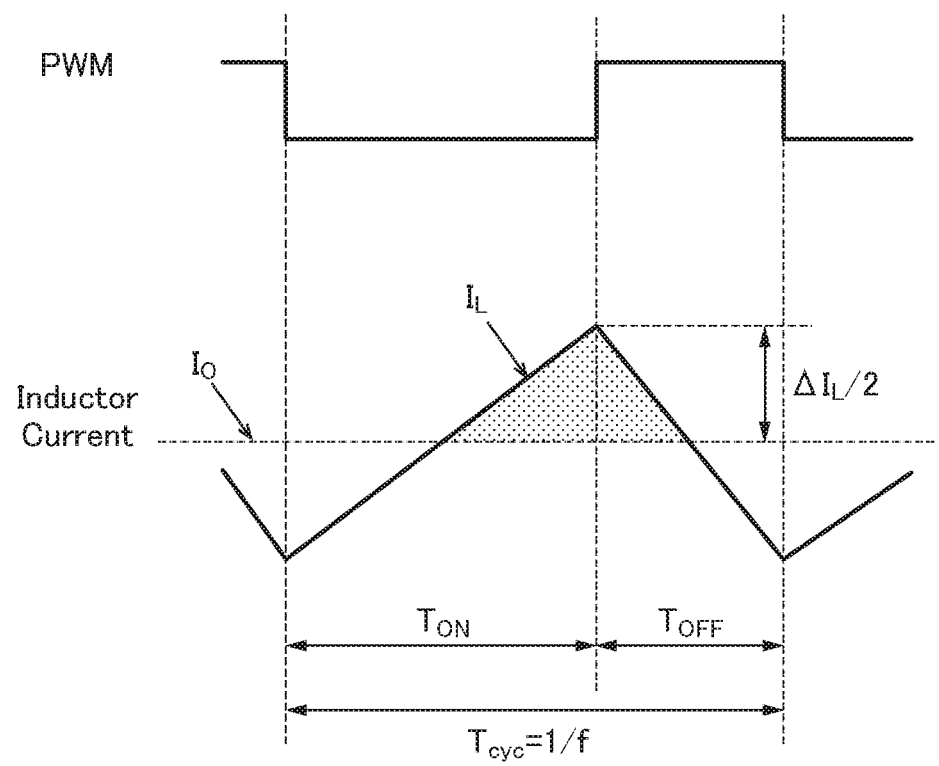
FIG. 9 is an operating waveform diagram of the switching power supply.

The control signals G1 and G2 are supplied to the gate electrodes G of the respective MOS transistors Q1 and Q2 through their corresponding terminal electrodes T5. Thus, when the PWM control signal is supplied from the controller 120, the MOS transistors Q1 and Q2 are turned ON in an exclusive manner. As illustrated in FIG. 9, which is an operating waveform graph, during a period $T_{ON}$ during which the MOS transistor Q1 is turned ON (MOS transistor Q2 is turned OFF), the inductor L is excited to increase inductor current $I_L$. In this period, current denoted by a symbol $I_{ON}$ illustrated in FIG. 8 flows. On the other hand, during a period $T_{OFF}$ during which the MOS transistor Q1 is turned OFF (MOS transistor Q2 is turned ON), exciting energy stored in the inductor L is released to reduce the inductor current $I_L$. In this period, current denoted by a symbol $I_{OFF}$ illustrated in FIG. 8 flows. Such variations in the inductor current $I_L$ is smoothed by the output capacitor Co, and thus desired output current $I_O$ is applied to the load circuit 140. Thus, by changing the duty ratio of the period $T_{ON}$ with a cycle Tcyc (frequency f of the PWM control signal) of the PWM control signal fixed, it is possible to apply desired output current Io to the load circuit 140 while maintaining the output voltage Vout at a constant level lower than the input voltage Vin.

The output voltage Vout is fed back to the controller 120. The controller 120 monitors the output voltage Vout. When the output voltage Vout is less than a reference value, the controller 120 reduces the duty ratio of the PMW control signal; while when the output voltage Vout is equal to or less than a reference value, it increases the duty ratio of the PMW control signal. Through such feedback control, the level of the output voltage Vout is maintained substantially constant.

As described above, the MOS transistor embedded substrate 1 according to the present embodiment can be applied to a non-insulated synchronous rectification type step-down converter. In the example illustrated in FIG. 8, the gate driver 110 and the boot strap capacitor BC are mounted on the surface 1b of the MOS transistor embedded substrate 1, and other elements, i.e., the controller 120, input capacitor Ci, output capacitor Co, inductor L and the like are disposed outside; however, some or all these elements may be mounted on or incorporated in the MOS transistor embedded substrate 1 according to the present embodiment.

Figure 10:
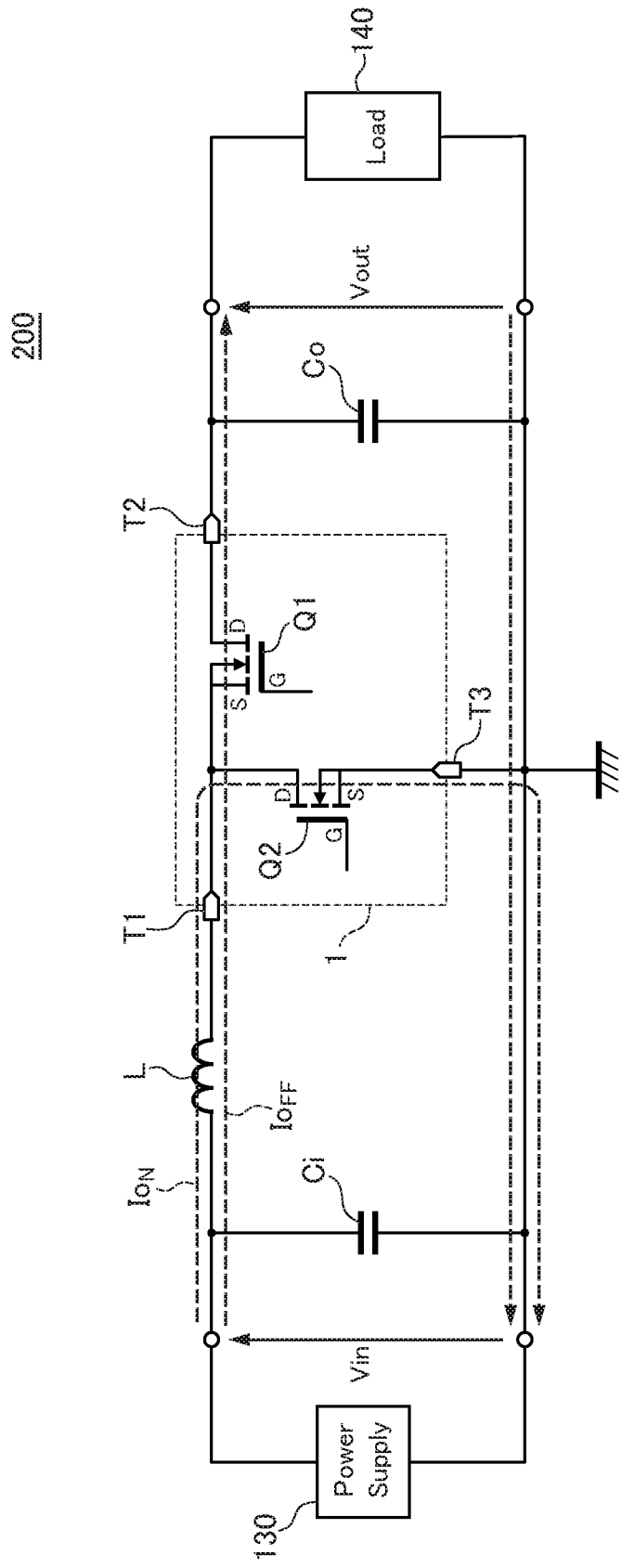
FIG. 10 is a circuit diagram of a switching power supply 200 using the MOS transistor embedded substrate according to the first embodiment of the present invention, where a non-isolated synchronous1 rectification type boosting converter is constituted.

FIG. 10 is a circuit diagram of a switching power supply 200 using the MOS transistor embedded substrate 1 according to the present embodiment. In the example of FIG. 10, a non-insulated synchronous rectification type boosting converter is constituted. In FIG. 10, elements such as a controller and a gate driver are omitted from illustration.

In the switching power supply 200 illustrated in FIG. 10, the inductor L is connected between the DC power supply 130 and the terminal electrode T1, the load circuit 140 is connected to the terminal electrode T2, and the terminal electrode T3 is grounded. With the above configuration, during a period $T_{ON}$ during which the MOS transistor Q2 is turned ON (MOS transistor Q1 is turned OFF), the inductor L is excited. In this period, current denoted by a symbol $I_{ON}$ illustrated in FIG. 10 flows. On the other hand, during a period $T_{OFF}$ during which the MOS transistor Q2 is turned OFF (MOS transistor Q1 is turned ON), exciting energy stored in the inductor L is released. In this period, current denoted by a symbol $I_{OFF}$ illustrated in FIG. 10 flows. In the present example, the inductor L is connected in series to the DC power supply 130, so that the exciting energy is superimposed on the input voltage Vin from the DC power supply 130. As a result, it is possible to apply output voltage Vout higher than the input voltage Vin to the load circuit 140.

Figure 11:
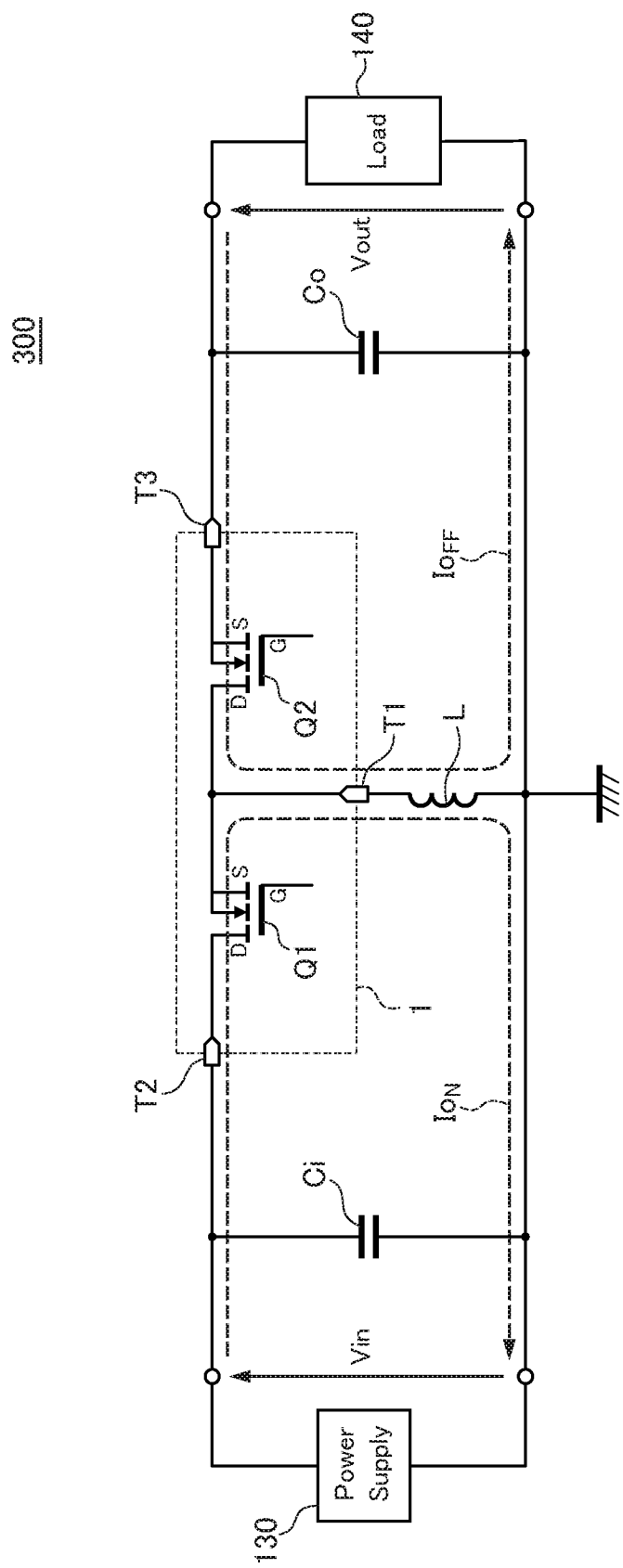
FIG. 11 is a circuit diagram of a switching power supply 300 using the MOS transistor embedded substrate according to the first embodiment of the present invention, where a non-isolated synchronous rectification type reverse converter is constituted.

FIG. 11 is a circuit diagram of a switching power supply 300 using the MOS transistor embedded substrate 1 according to the present embodiment. In the example of FIG. 11, a non-insulated synchronous rectification type reverse converter is constituted. In FIG. 11, elements such as a controller and a gate driver are omitted from illustration.

In the switching power supply 300 illustrated in FIG. 11, the DC power supply 130 is connected to the terminal electrode T2, the load circuit 140 is connected to the terminal electrode T3, and the terminal electrode T1 is grounded through the inductor L. With the above configuration, during a period $T_{ON}$ during which the MOS transistor Q1 is turned ON (MOS transistor Q2 is turned OFF), the inductor L is excited. In this period, current denoted by a symbol $I_{ON}$ illustrated in FIG. 11 flows. On the other hand, during a period $T_{OFF}$ during which the MOS transistor Q1 is turned OFF (MOS transistor Q2 is turned ON), exciting energy stored in the inductor L is released. In this period, current denoted by a symbol $I_{OFF}$ illustrated in FIG. 11 flows. In the present example, the inductor L is connected in parallel to the load circuit 140, so that the output voltage Vout applied to the load circuit 140 assumes a negative value, making it possible to generate an inverted voltage.

Figure 12:
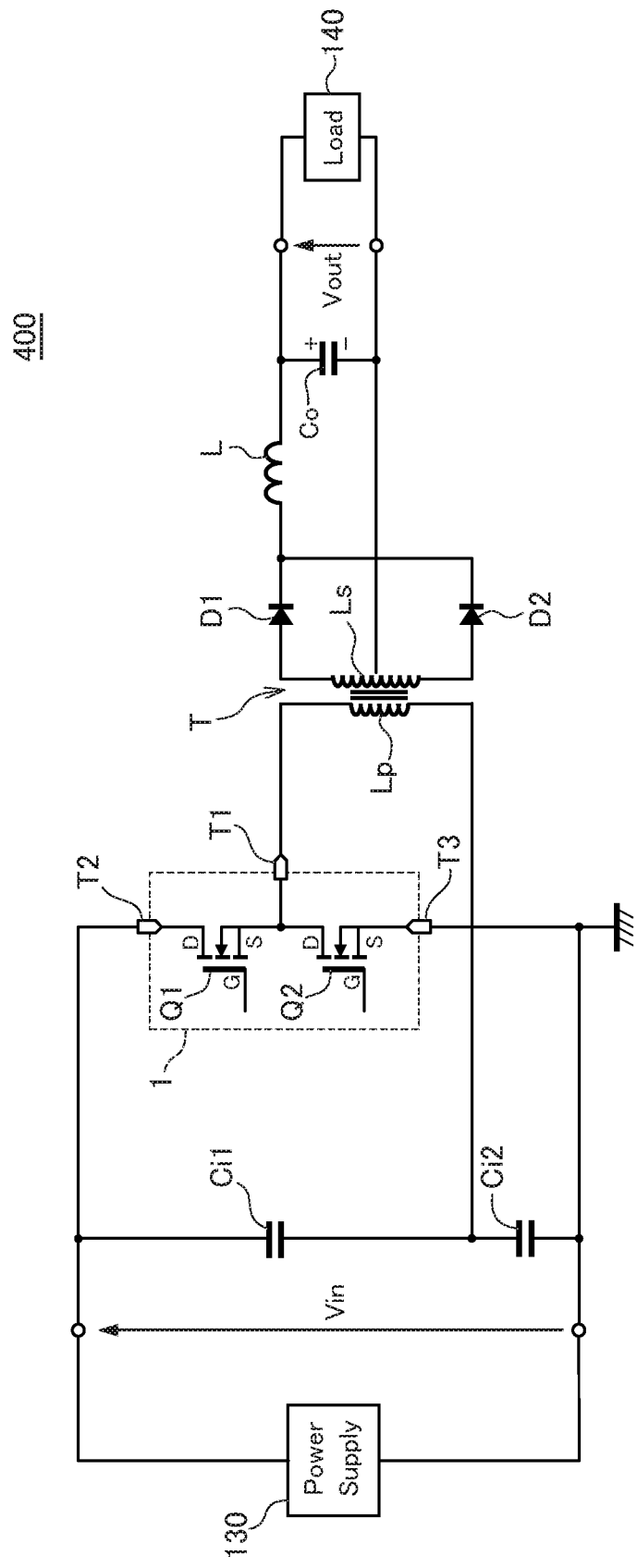
FIG. 12 is a circuit diagram of a switching power supply 400 using the MOS transistor embedded substrate according to the first embodiment of the present invention, where a half-bridge insulated transformer is constituted.

FIG. 12 is a circuit diagram of a switching power supply 400 using the MOS transistor embedded substrate 1 according to the present embodiment. In the example of FIG. 12, a half-bridge insulated transformer is constituted. In FIG. 12, elements such as a controller and a gate driver are omitted from illustration.

In the switching power supply 400 illustrated in FIG. 12, the input voltage Vin is applied between the terminal electrodes T2 and T3 from the DC power supply 130, and the terminal electrode T1 is connected to a connection point between input capacitors Ci1 and Ci2 through a primary winding Lp of a transformer T. Both ends of a secondary winding Ls of the transformer T are connected to one end of the inductor L respectively through a diode D1 and a diode D2. The output capacitor Co is connected to the other end of the inductor L and the midpoint of the secondary winding Ls of the transformer T. With the above configuration, during a period during which the MOS transistor Q1 is turned ON (MOS transistor Q2 is turned OFF), current flows in one direction in the primary winding Lp of the transformer T. On the other hand, during a period during which the MOS transistor Q1 is turned OFF (MOS transistor Q2 is turned ON), current flows in the opposite direction in the primary winding Lp of the transformer T. As a result, voltage according to the turn ratio of the winding is generated in the secondary winding Ls of the transformer T, and the generated voltage is rectified by the diodes D1 and D2, thus making it possible to apply the output voltage Vout according to the turn ratio of winding of the transformer T to the load circuit 140.

Figure 13:
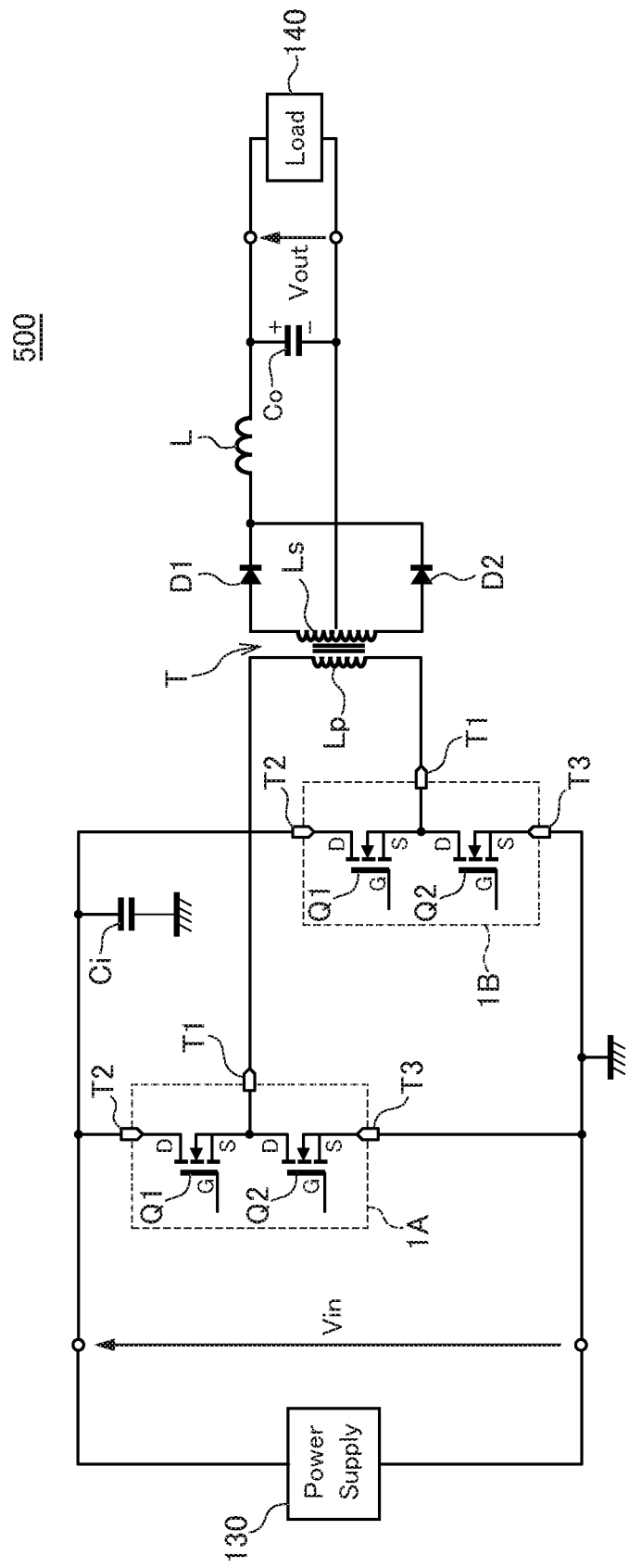
FIG. 13 is a circuit diagram of a switching power supply 500 using the MOS transistor embedded substrate according to the first embodiment of the present invention, where a full-bridge insulated transformer is constituted.

FIG. 13 is a circuit diagram of a switching power supply 500 using the MOS transistor embedded substrate 1 according to the present embodiment. In the example of FIG. 13, a full-bridge insulated transformer is constituted. In FIG. 13, elements such as a controller and a gate driver are omitted from illustration.

The switching power supply 500 illustrated in FIG. 13 differs from the switching power supply 400 illustrated in FIG. 12 in that two MOS transistor embedded substrates 1A and 1B are connected in parallel and that the primary winding Lp of the transformer T is connected between the terminal electrode T1 of the MOS transistor embedded substrate 1A and the terminal electrode T1 of the MOS transistor embedded substrate 1B. The MOS transistor Q1 of the MOS transistor embedded substrate 1A and the MOS transistor Q2 of the MOS transistor embedded substrate 1B overlap each other in terms of ON-period. Similarly, the MOS transistor Q2 of the MOS transistor embedded substrate 1A and MOS transistor Q1 of the MOS transistor embedded substrate 1B overlap each other in terms of ON-period. Thus, basically the same operation as the switching power supply 400 illustrated in FIG. 12 is performed in the switching power supply 500; however, in this case, the operations of the MOS transistors Q1 and Q2 included in the MOS transistor embedded substrate 1A can be controlled independently of each other and, similarly, the operations of the MOS transistors Q1 and Q2 included in the MOS transistor embedded substrate 1B can be controlled independently of each other, thus making it possible to control the flow of ON-current with high accuracy.

The MOS transistor embedded substrate 1A and MOS transistor embedded substrate 1B need not be separate circuit substrates, and the four MOS transistors may be incorporated in a single substrate.

As described above, the MOS transistor embedded substrate 1 according to the present embodiment can be used for various switching power supplies.

Second Embodiment

Figure 14:
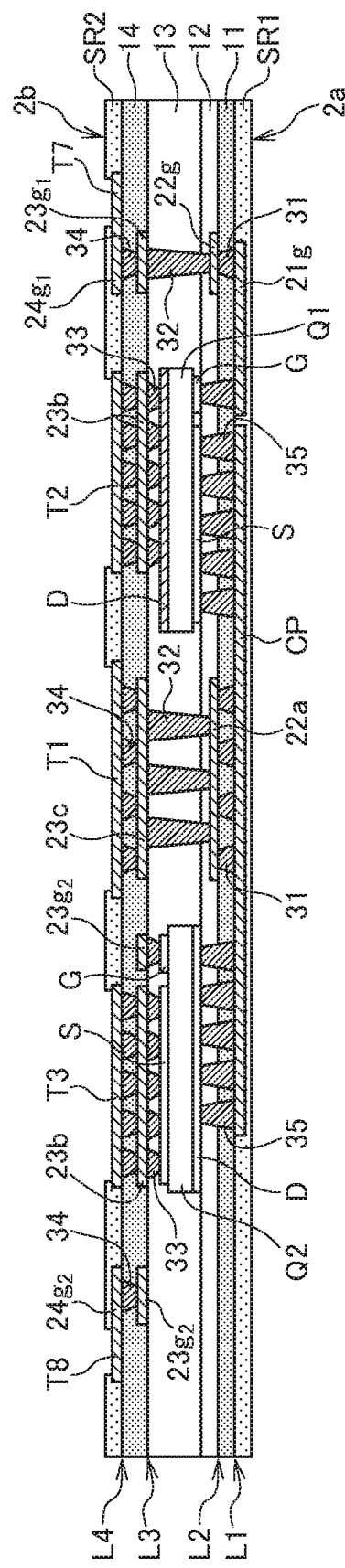
FIG. 14 is a schematic cross-sectional view for explaining the structure of a MOS transistor embedded substrate according to a second embodiment of the present invention.
Figure 15:
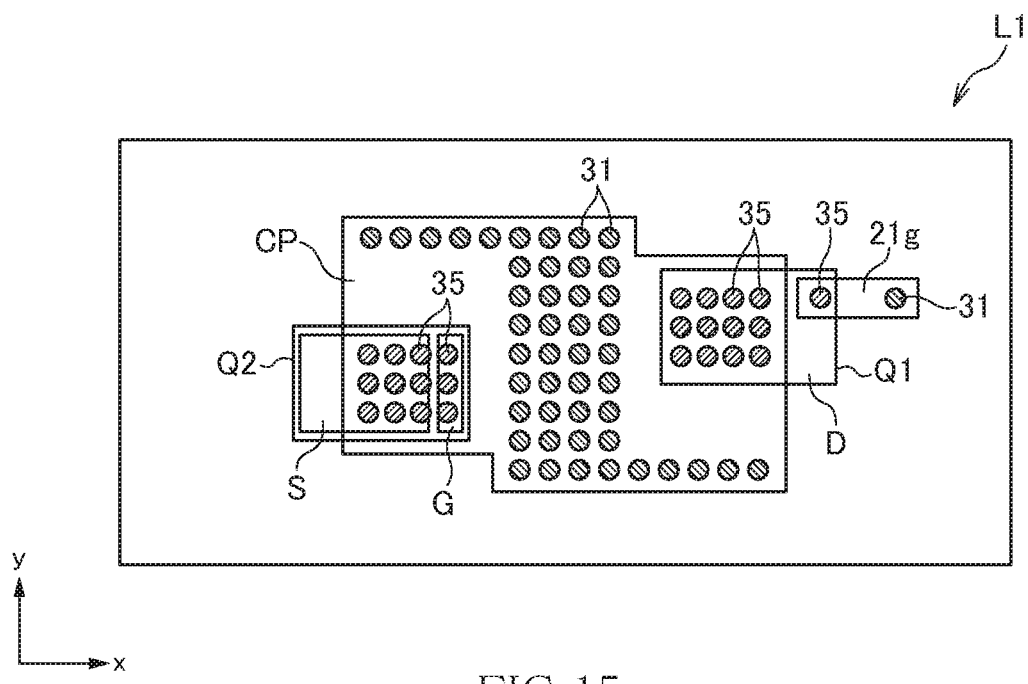
FIG. 15 is a plan view illustrating the pattern shapes of the wiring layer L1 according to the second embodiment of the present invention.
Figure 16:
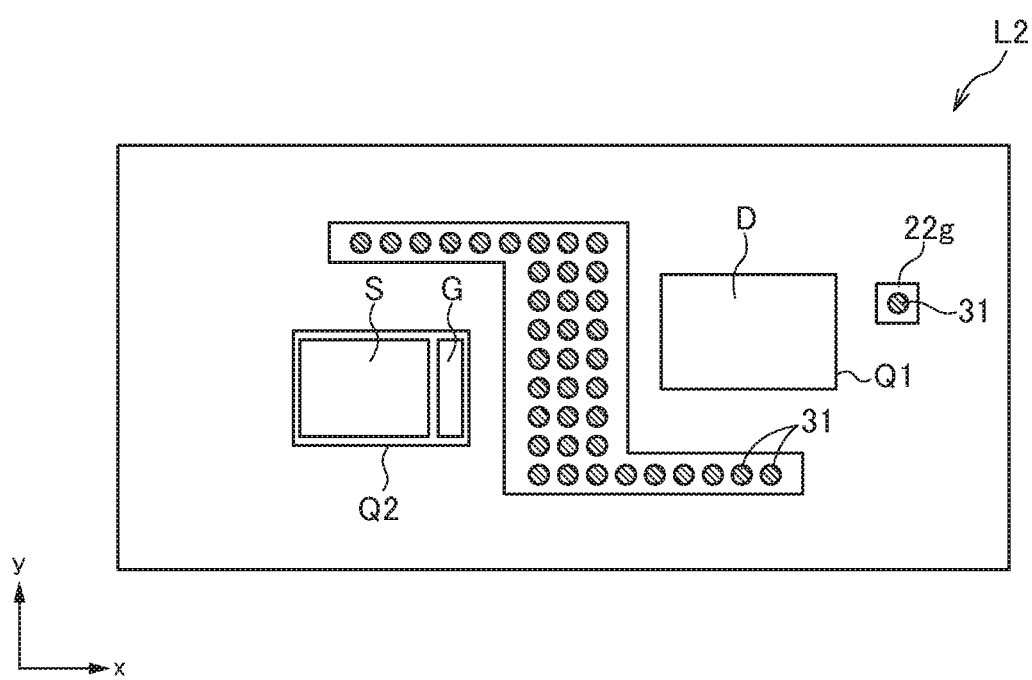
FIG. 16 is a plan view illustrating the pattern shapes of the wiring layer L2 according to the second embodiment of the present invention.
Figure 17:
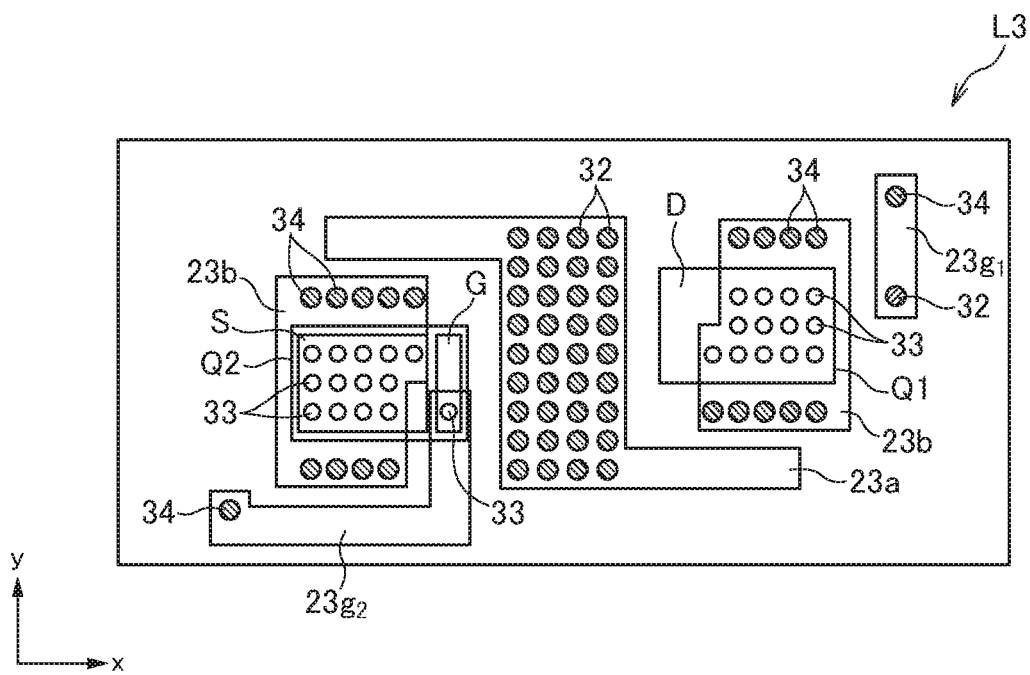
FIG. 17 is a plan view illustrating the pattern shapes of the wiring layer L3 according to the second embodiment of the present invention.
Figure 18:
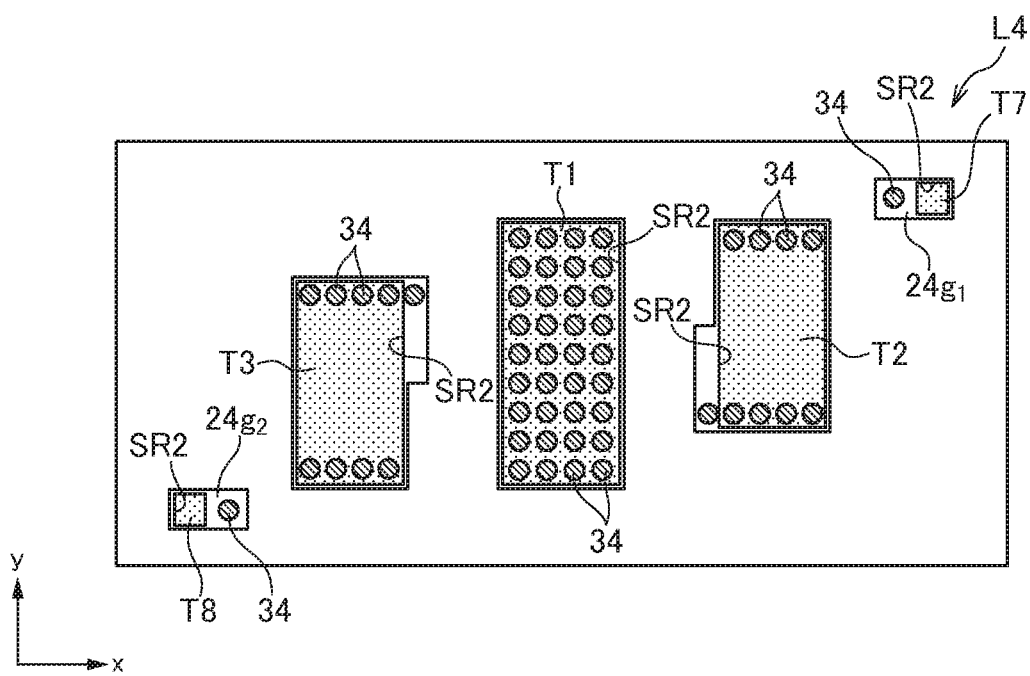
FIG. 18 is a plan view illustrating the pattern shapes of the wiring layer L4 according to the second embodiment of the present invention.

FIG. 14 is a schematic cross-sectional view for explaining the structure of a MOS transistor embedded substrate 2 according to the second embodiment of the present invention. FIGS. 15 to 18 are plan views illustrating the pattern shapes of the wiring layers L1 to L4, respectively, as viewed from above (a surface 2b side). For easy understanding of the positional relationship among respective elements, the positions of the respective MOS transistors Q1 and Q2 viewed from the top are illustrated in FIGS. 15 to 17.

As illustrated in FIGS. 14 to 18, the MOS transistor embedded substrate 2 according to the second embodiment differs from the MOS transistor embedded substrate 1 according to the first embodiment illustrated in FIG. 1 in that the front and back sides of each of the MOS transistors Q1 and Q2 are reversed from those of each of the MOS transistors Q1 and Q2 of the first embodiment and that the terminal electrodes T1 to T3, T7 and T8 are formed on the upper side (surface 2b side) of the substrate. The terminal electrodes are not exposed on the lower surface (surface 2a). In FIGS. 14 to 18, the same reference numerals are given to the same elements of the MOS transistor embedded substrate 1 according to the first embodiment, and overlapping description will be omitted.

The terminal electrode T7 is a terminal connected to the gate electrode G of the MOS transistor Q1, and the terminal electrode T8 is a terminal connected to the gate electrode G of the MOS transistor Q2. Specifically, the terminal electrode T7 is connected to the gate electrode G of the MOS transistor Q1 through the conductor pattern $24g_1$, via conductor 34, conductor pattern $23g_1$, via conductor 32, conductor pattern 22g, via conductor 31, conductor pattern 21g and via conductor 35, and the terminal electrode T8 is connected to the gate electrode G of the MOS transistor Q2 through the conductor pattern $24g_2$, via conductor 34, conductor pattern $23g_2$ and via conductor 33.

In producing the MOS transistor embedded substrate 2, the wiring layers L1 and L2 are first formed on both surfaces of the insulation resin layer 11, and then the insulation resin layer 12, insulation resin layer 13, wiring layer L3, insulation resin layer 14 and wiring layer L4 are formed in this order. Then, in the present embodiment, the produced MOS transistor embedded substrate 2 is reversed and mounted on another substrate such as a mother board with the surface 2b as a mounting surface. No terminal electrode is provided on the surface 2a, and the gate driver, boot strap capacitor and the like are mounted on another substrate such as a mother board.

As exemplified in the present embodiment, in the present invention, the up-down direction at the production process of the MOS transistor embedded substrate and the up-down direction in actual use may be reversed. Further, the terminal electrode need not be provided on both surfaces of the substrate and may be provided on only one surface.

Third Embodiment

Figure 19:
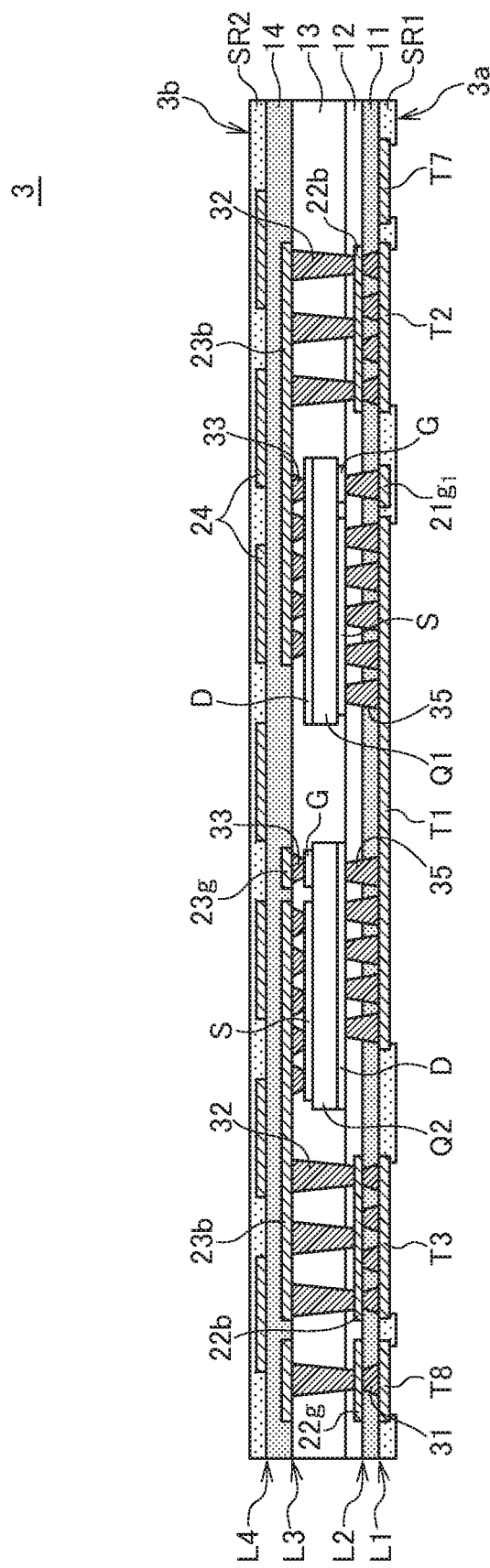
FIG. 19 is a schematic cross-sectional view for explaining the structure of a MOS transistor embedded substrate according to a third embodiment of the present invention.
Figure 20:
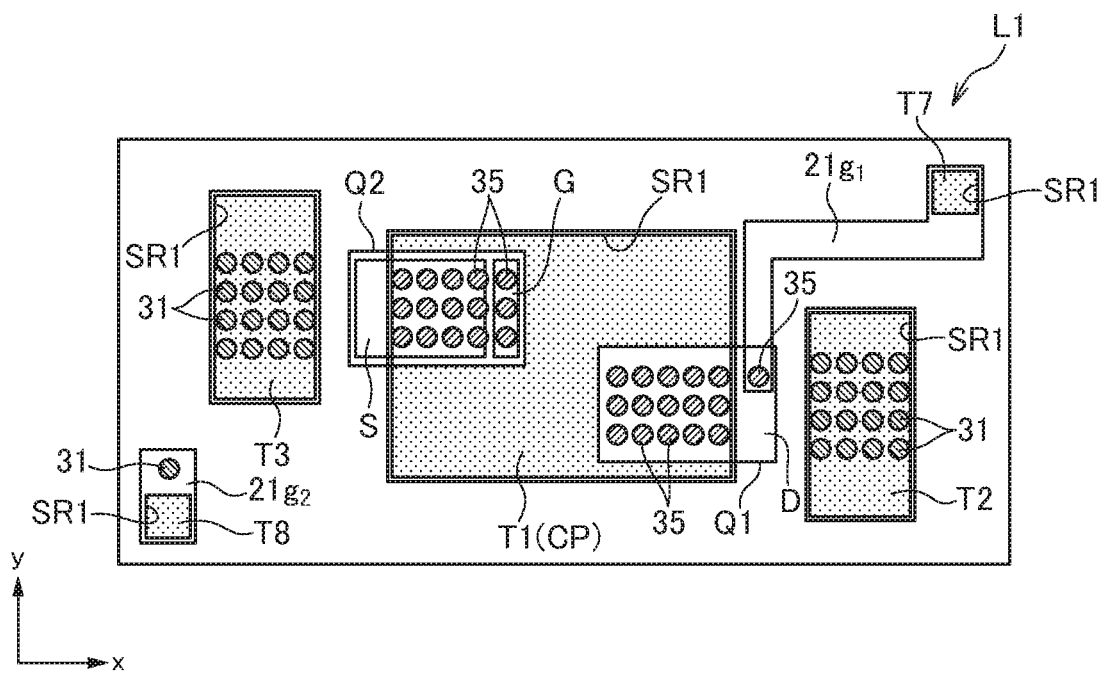
FIG. 20 is a plan view illustrating the pattern shapes of the wiring layer L1 according to the third embodiment of the present invention.
Figure 21:
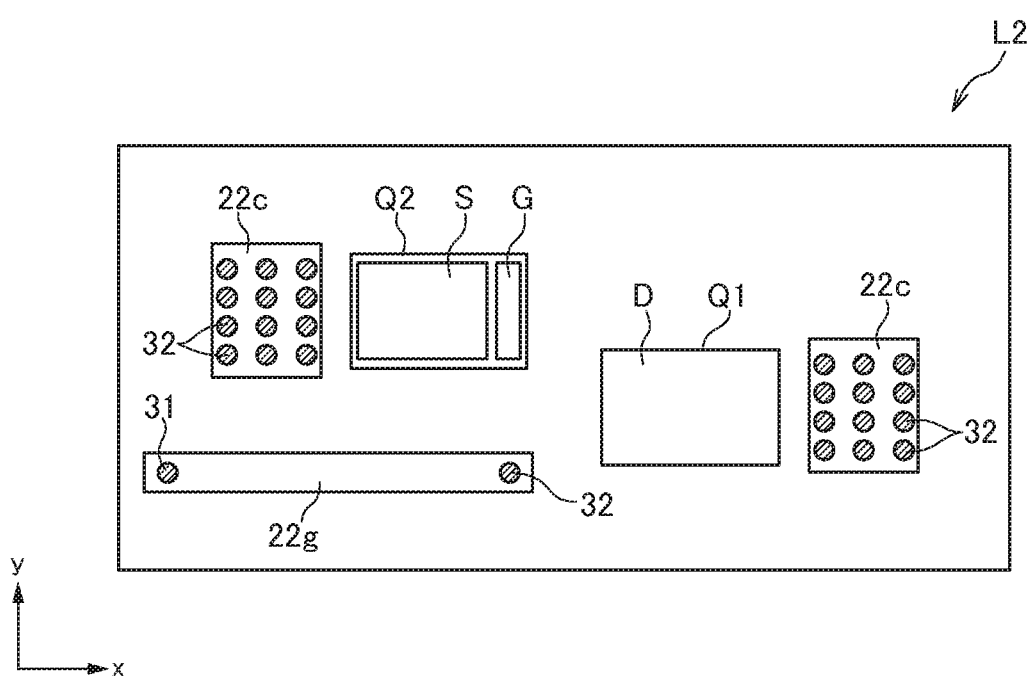
FIG. 21 is a plan view illustrating the pattern shapes of the wiring layer L2 according to the third embodiment of the present invention.
Figure 22:
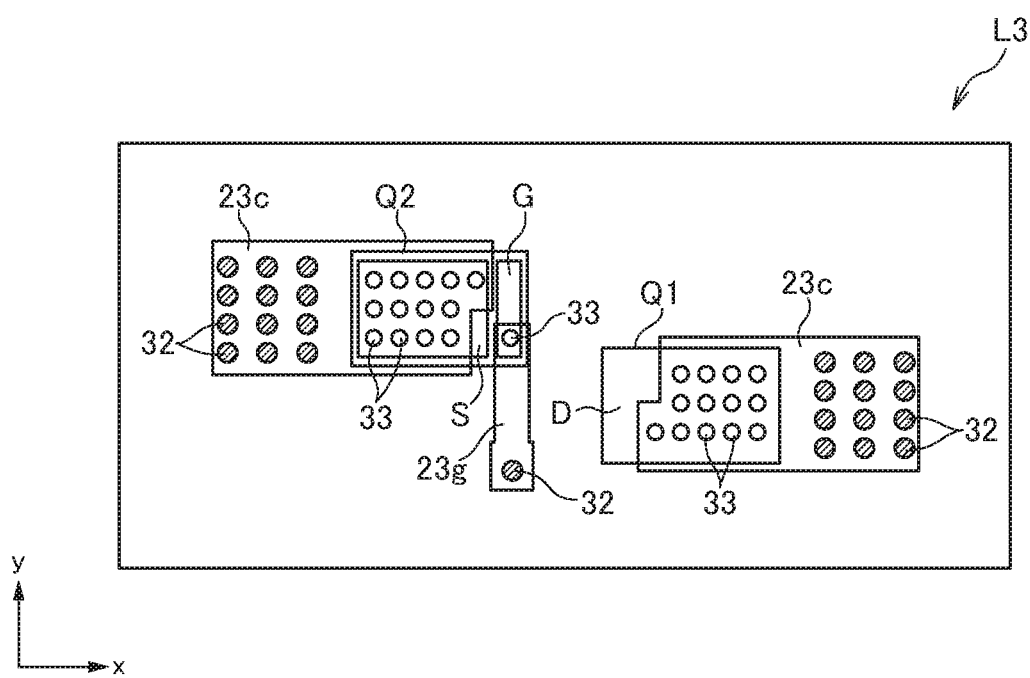
FIG. 22 is a plan view illustrating the pattern shapes of the wiring layer L3 according to the third embodiment of the present invention.

FIG. 19 is a schematic cross-sectional view for explaining the structure of a MOS transistor embedded substrate 3 according to the third embodiment of the present invention. FIGS. 20 to 22 are plan views illustrating the pattern shapes of the wiring layers L1 to L3, respectively, as viewed from above (a surface 3b side). For easy understanding of the positional relationship among respective elements, the positions of the respective MOS transistors Q1 and Q2 viewed from the top are illustrated in FIGS. 20 to 22.

As illustrated in FIGS. 19 to 22, the MOS transistor embedded substrate 3 according to the third embodiment differs from the MOS transistor embedded substrate 1 according to the first embodiment illustrated in FIG. 1 in that the front and back sides of each of the MOS transistors Q1 and Q2 are reversed from those of each of the MOS transistors Q1 and Q2 of the first embodiment and that the terminal electrodes T7 and T8 are formed on the lower side (surface 3a side) of the substrate. The terminal electrodes are not exposed on the upper surface (surface 3b). In FIGS. 19 to 22, the same reference numerals are given to the same elements of the MOS transistor embedded substrates 1 and 2 according to the first and second embodiments, and overlapping description will be omitted.

In the present embodiment, the source electrode S of the MOS transistor Q1 and the drain electrode D of the MOS transistor Q2 are directly connected to the terminal electrode T1 through the plurality of via conductors 35. That is, in the present embodiment, the source electrode S of the MOS transistor Q1 and the drain electrode D of the MOS transistor Q2 face the surface 3a side, so that it is possible to directly connect the source electrode S of the MOS transistor Q1 and the drain electrode D of the MOS transistor Q2 to the terminal electrode T1 without letting them pass through the via conductor 32 penetrating the insulation resin layer 13. In the present embodiment, the terminal electrode T1 serves also as the coupling wiring pattern CP.

On the other hand, the drain electrode D of the MOS transistor Q1 is connected to the terminal electrode T2 through the via conductor 32 penetrating the insulation resin layer 13, and the source electrode S of the MOS transistor Q2 is connected to the terminal electrode T3 through the via conductor 32 penetrating the insulation resin layer 13. The terminal electrode T7 is connected to the gate electrode G of the MOS transistor Q1 through a conductor pattern $21g_1$ and the via conductor 35. The terminal electrode T8 is connected to the gate electrode G of the MOS transistor Q2 through a conductor pattern $21g_2$, the via conductor 31, conductor pattern $22g$, via conductor 32, conductor pattern $23g$ and via conductor 33.

In the present embodiment, the MOS transistor embedded substrate 3 is mounted on another substrate such as a mother board with the surface 3a as a mounting surface. No terminal electrode is provided on the surface 3b, and the gate driver, boot strap capacitor and the like are mounted on another substrate such as a mother board.

As exemplified in the present embodiment, in the present invention, it is not always necessary to short-circuit the source electrode S of the MOS transistor Q1 and drain electrode D of the MOS transistor Q2 by the coupling wiring pattern CP embedded inside the substrate, or to connect the coupling wiring pattern CP and the terminal electrode T1 through the via conductor 32 penetrating the insulation resin layer 13, and the source electrode S of the MOS transistor Q1 and the drain electrode D of the MOS transistor Q2 may be directly connected to the terminal electrode T1. In this case, heat generated by operation of the MOS transistors Q1 and Q2 is radiated to a mother board or the like mainly through the terminal electrode T1.

Fourth Embodiment

Figure 23:
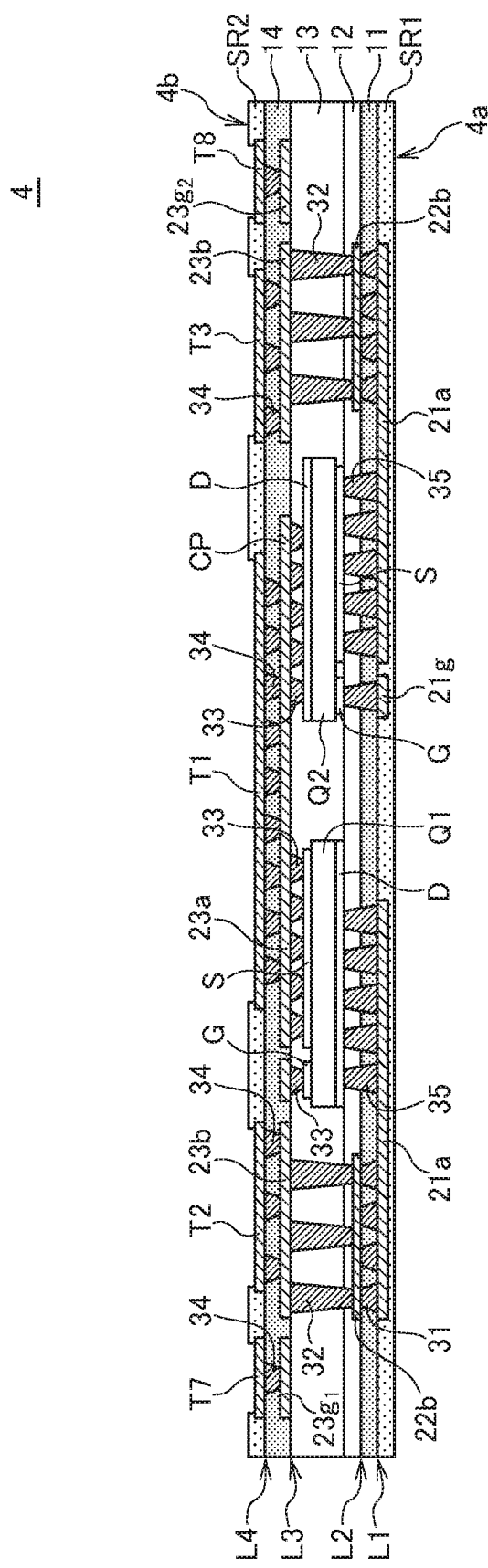
FIG. 23 is a schematic cross-sectional view for explaining the structure of a MOS transistor embedded substrate according to a fourth embodiment of the present invention.
Figure 24:
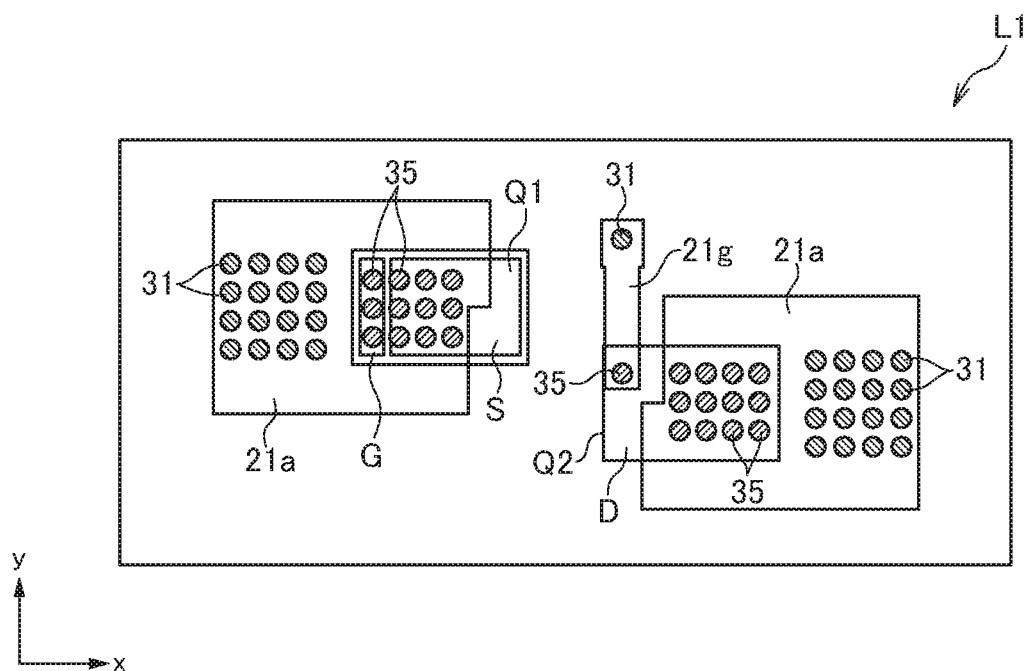
FIG. 24 is a plan view illustrating the pattern shapes of the wiring layer L1 according to the fourth embodiment of the present invention.
Figure 25:
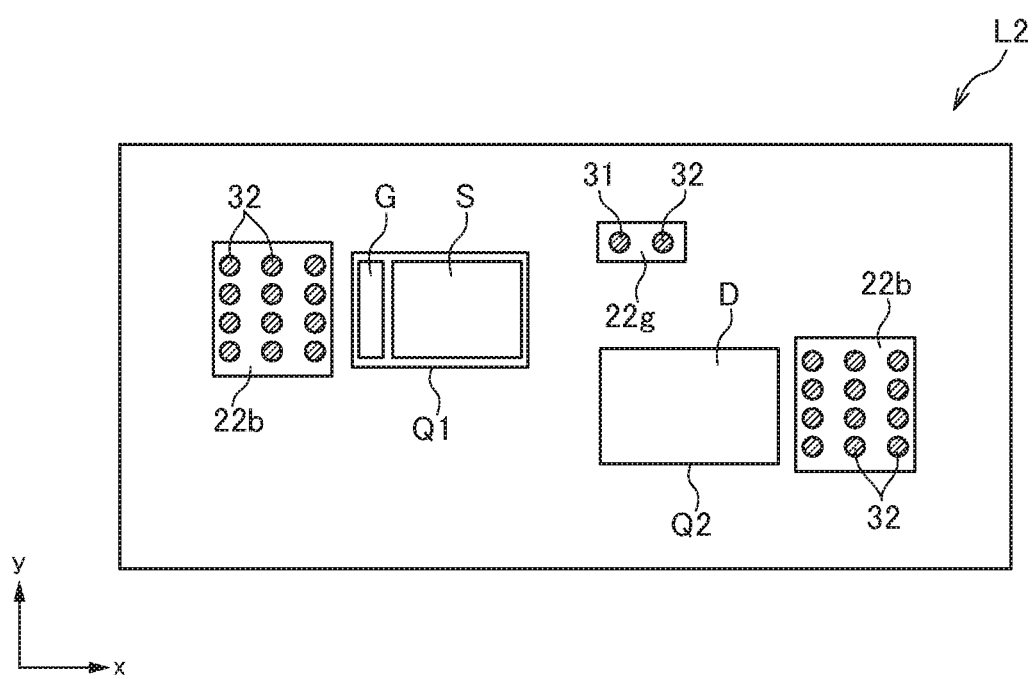
FIG. 25 is a plan view illustrating the pattern shapes of the wiring layer L2 according to the fourth embodiment of the present invention.
Figure 26:
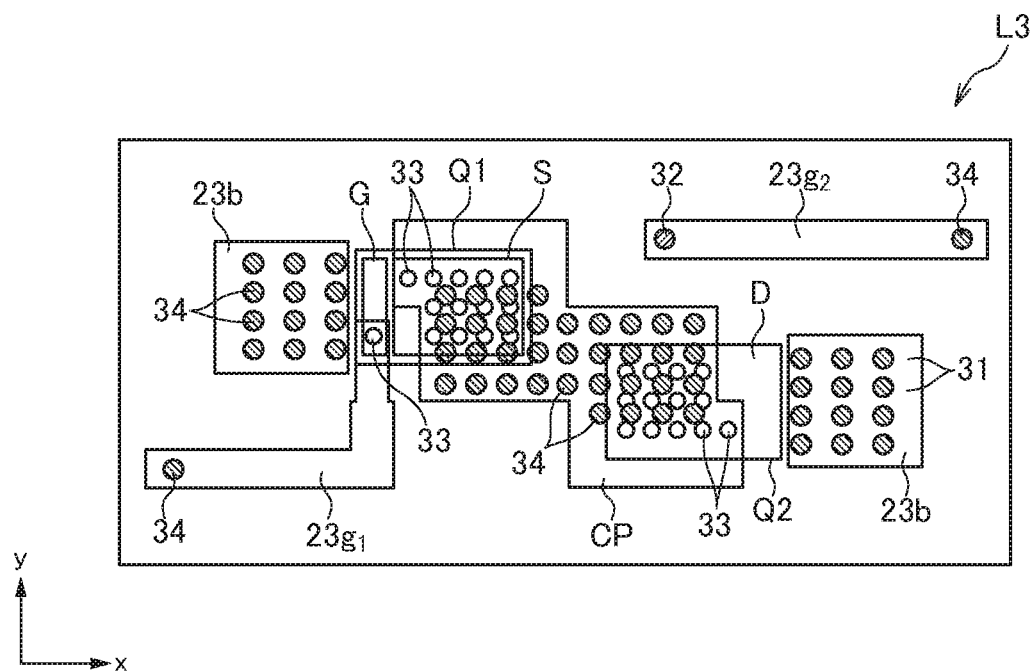
FIG. 26 is a plan view illustrating the pattern shapes of the wiring layer L3 according to the fourth embodiment of the present invention.
Figure 27:
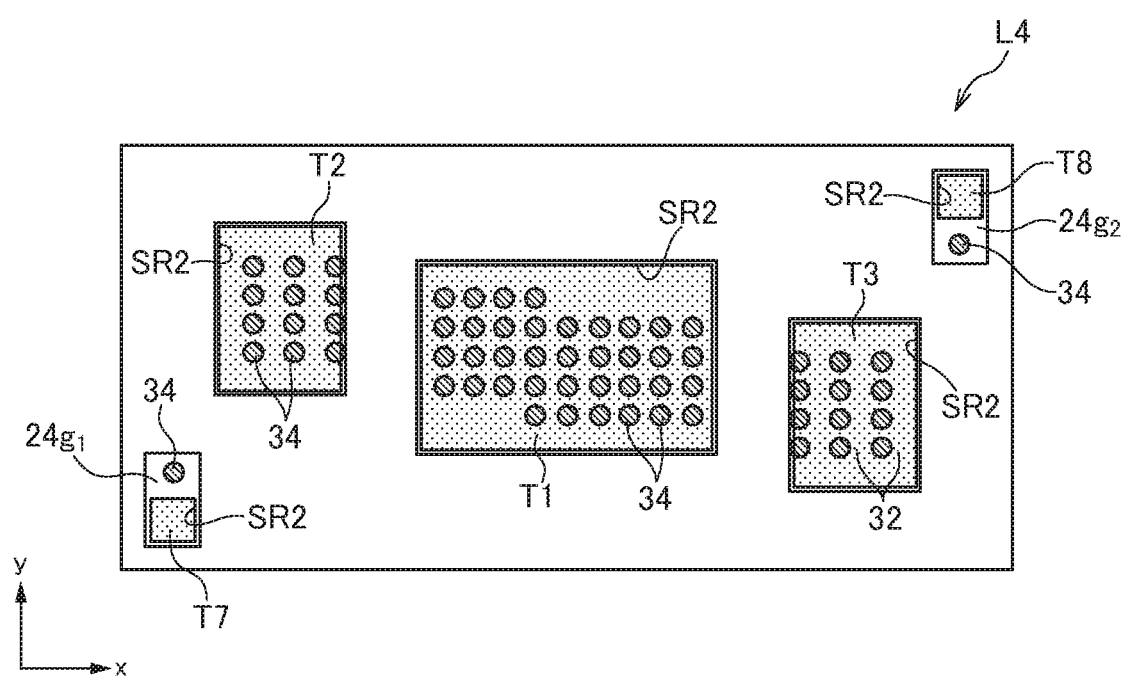
FIG. 27 is a plan view illustrating the pattern shapes of the wiring layer L4 according to the fourth embodiment of the present invention.

FIG. 23 is a schematic cross-sectional view for explaining the structure of a MOS transistor embedded substrate 4 according to the fourth embodiment of the present invention. FIGS. 24 to 27 are plan views illustrating the pattern shapes of the wiring layers L1 to L3, respectively, as viewed from above (a surface 4b side). For easy understanding of the positional relationship among respective elements, the positions of the respective MOS transistors Q1 and Q2 viewed from the top are illustrated in FIGS. 24 to 26.

As illustrated in FIGS. 23 to 27, the MOS transistor embedded substrate 4 according to the fourth embodiment differs from the MOS transistor embedded substrate 1 according to the first embodiment illustrated in FIG. 1 in that the terminal electrodes T1 to T3, T7 and T8 are formed on the upper side (surface 4b side) of the substrate although the front and back sides of each of the MOS transistors Q1 and Q2 and those of each of the MOS transistors Q1 and Q2 of the first embodiment face the same directions, respectively. The terminal electrodes are not exposed on the lower surface (surface 4a). In FIGS. 23 to 26, the same reference numerals are given to the same elements of the MOS transistor embedded substrates 1 to 3 according to the first to third embodiments, and overlapping description will be omitted.

In the present embodiment, the source electrode S of the MOS transistor Q1 and the drain electrode D of the MOS transistor Q2 are connected to the coupling wiring pattern CP through the plurality of via conductors 33. The coupling wiring pattern CP is connected to the terminal electrode T1 through the plurality of via conductors 34. That is, in the present embodiment, the source electrode S of the MOS transistor Q1 and the drain electrode D of the MOS transistor Q2 face the surface 4b side, and the terminal electrode T1 is provided on the surface 4b side, so that it is possible to connect the source electrode S of the MOS transistor Q1 and the drain electrode D of the MOS transistor Q2 to the terminal electrode T1 without letting them pass through the via conductor 32 penetrating the insulation resin layer 13.

On the other hand, as in the third embodiment, the drain electrode D of the MOS transistor Q1 is connected to the terminal electrode T2 through the via conductor 32 penetrating the insulation resin layer 13, and the source electrode S of the MOS transistor Q2 is connected to the terminal electrode T3 through the via conductor 32 penetrating the insulation resin layer 13. The terminal electrode T7 is connected to the gate electrode G of the MOS transistor Q1 through the conductor pattern $24g_1$, via conductor 34, conductor pattern $23g_1$ and via conductor 33. The terminal electrode T8 is connected to the gate electrode G of the MOS transistor Q2 through the conductor pattern $24g_2$, via conductor 34, conductor pattern $23g_2$, via conductor 32, conductor pattern $22g$, via conductor 31, conductor pattern $21g$ and via conductor 35.

In the present embodiment, the MOS transistor embedded substrate 4 is mounted on another substrate such as a mother board with the surface 4b as a mounting surface. No terminal electrode is provided on the surface 4a, and the gate driver, boot strap capacitor and the like are mounted on another substrate such as a mother board.

As exemplified in the present embodiment, even when the coupling wiring pattern CP embedded inside the substrate is used, the coupling wiring pattern CP and the terminal electrode T1 may be connected without being made to pass through the via conductor 32 penetrating the insulation resin layer 13.

It is apparent that the present invention is not limited to the above embodiments, but may be modified and changed without departing from the scope and spirit of the invention.

For example, although n-channel type MOS transistor is used as the MOS transistors Q1 and Q2 in the above embodiments, the present invention is not limited to this, and a p-channel type MOS transistor may be used. Further, in the present invention, a vertical device such as an IGBT (Insulated Gate Bipolar Transistor) in which a MOS transistor is assembled to a base may be used. In this case, the emitter electrode of the IGBT corresponds to the "source electrode" in the present invention, and the collector electrode thereof corresponds to the "drain electrode" in the present invention. Thus, the "source electrode", "drain electrode" and "gate electrode" in the present invention may be replaced with one another as appropriate according to the type of the vertical device to be used.

What is claimed is:

1. A MOS transistor embedded substrate comprising:
   first and second MOS transistors each having a source electrode formed on one surface and a drain electrode formed on other surface;
   an insulation resin layer in which the first and second MOS transistors are embedded such that the source electrode of the first MOS transistor and the drain electrode of the second MOS transistor face a same direction and that the drain electrode of the first MOS transistor and the source electrode of the second MOS transistor face a same direction;
   a first terminal electrode connected to the source electrode of the first MOS transistor and the drain electrode of the second MOS transistor;
   a second terminal electrode connected to the drain electrode of the first MOS transistor; and
   a third terminal electrode connected to the source electrode of the second MOS transistor.

2. The MOS transistor embedded substrate as claimed in claim 1, further comprising a coupling wiring pattern connecting the source electrode of the first MOS transistor and the drain electrode of the second MOS transistor,
   wherein the first terminal electrode is connected to the coupling wiring pattern.

3. The MOS transistor embedded substrate as claimed in claim 2, further comprising a first via conductor provided so as to penetrate the insulation resin layer,
   wherein the first via conductor connects the coupling wiring pattern and the first terminal electrode.

4. The MOS transistor embedded substrate as claimed in claim 3, wherein the first via conductor is disposed between the first and second MOS transistors in a plan view.

5. The MOS transistor embedded substrate as claimed in claim 1, further comprising a first surface and a second surface positioned on an opposite side of the first surface,
   wherein the first to third terminal electrodes are exposed on the first surface.

6. The MOS transistor embedded substrate as claimed in claim 5, further comprising a component mounting area on the second surface.

7. The MOS transistor embedded substrate as claimed in claim 1, further comprising:
   a second via conductor provided so as to penetrate the insulation resin layer and to connect the drain electrode of the first MOS transistor and the second terminal electrode; and
   a third via conductor provided so as to penetrate the insulation resin layer and to connect the source electrode of the second MOS transistor and the third terminal electrode.

8. A switching power supply comprising:
   a MOS transistor embedded substrate including:
      first and second MOS transistors each having a source electrode formed on one surface and a drain electrode formed on other surface; and
      an insulation resin layer in which the first and second MOS transistors are embedded such that the source electrode of the first MOS transistor and the drain electrode of the second MOS transistor face a same direction and that the drain electrode of the first MOS transistor and the source electrode of the second MOS transistor face a same direction; and
   a gate driver that supplies a drive signal to the gate electrodes of the respective first and second MOS transistors to turn ON the first and second MOS transistors in a mutually exclusive manner.

9. The switching power supply as claimed in claim 8, wherein the gate driver is mounted on the MOS transistor embedded substrate.

10. The switching power supply as claimed in claim 8, further comprising a boot strap capacitor connected between the first terminal electrode and the gate driver,
    wherein the boot strap capacitor is mounted on the MOS transistor embedded substrate.

11. An apparatus comprising:
    a first insulation layer having first and second surfaces opposite to each other;
    a second insulation layer having third and fourth surfaces opposite to each other, the second insulation layer being stacked on the first insulation layer such that the fourth surface of the second insulation layer is in contact with the first surface of the first insulation layer;
    a first transistor having first and second electrodes, the first transistor is embedded in the first and second insulation layers such that the first electrode is covered with the fourth surface of the second insulation layer and that the second electrode is covered with the first surface of the first insulation layer;
    a second transistor having third and fourth electrodes, the second transistor is embedded in the first and second insulation layers such that the third electrode is covered with the fourth surface of the second insulation layer and that the fourth electrode is covered with the first surface of the first insulation layer;

a first conductive pattern formed on the third surface of the second insulation layer;

second and third conductive patterns formed on the second surface of the first insulation layer;

a first via conductor provided so as to penetrate through the second insulation layer to connect the first electrode of the first transistor to the first conductive pattern;

a second via conductor provided so as to penetrate through the second insulation layer to connect the third electrode of the second transistor to the first conductive pattern;

a third via conductor provided so as to penetrate through the first insulation layer to connect the second electrode of the first transistor to the second conductive pattern; and a fourth via conductor provided so as to penetrate through the first insulation layer to connect the fourth electrode of the second transistor to the third conductive pattern.

12. The apparatus as claimed in claim 11, further comprising:

a fourth conductive pattern formed on the second surface of the first insulation layer; and a fifth via conductor provided so as to penetrate through the first and second insulation layers to connect the first conductive pattern to the fourth conductive pattern.

13. The apparatus as claimed in claim 12, wherein the fifth via conductor is arranged between the first and second transistors.

14. The apparatus as claimed in claim 11, further comprising:

fourth and fifth conductive patterns formed on the third surface of the second insulation layer;

a fifth via conductor provided so as to penetrate through the first and second insulation layers to connect the second conductive pattern to the fourth conductive pattern; and a sixth via conductor provided so as to penetrate through the first and second insulation layers to connect the third conductive pattern to the fifth conductive pattern.

15. The apparatus as claimed in claim 11,
wherein the first insulation layer includes first and second layers stacked on each other,
wherein the first layer has a core material, and
wherein the second layer is free from a core material.

16. The apparatus as claimed in claim 11,
wherein each of the first electrode of the first transistor and the fourth electrode of the second transistor is a source electrode, and
wherein each of the second electrode of the first transistor and the third electrode of the second transistor is a drain electrode.

* * * * *